United States Patent [19]

Uchiyama et al.

[11] Patent Number: 5,636,430
[45] Date of Patent: Jun. 10, 1997

[54] GENERAL-PURPOSE LEAD WORKING MACHINE

[75] Inventors: Shigeyuki Uchiyama; Yoshinao Todoroki; Shin Ando; Minoru Harayama, all of Nagano, Japan

[73] Assignee: Apic Yamada Corporation, Nagano, Japan

[21] Appl. No.: 352,106

[22] Filed: Nov. 30, 1994

[30] Foreign Application Priority Data

Nov. 30, 1993 [JP] Japan .................. 5-299902

[51] Int. Cl.⁶ .............. B23P 23/00; H01L 21/58
[52] U.S. Cl. .............. 29/564.7; 29/740; 29/827
[58] Field of Search .............. 29/566.3, 564.7, 29/827, 759, 740; 140/105; 437/220

[56] References Cited

U.S. PATENT DOCUMENTS

| | | | |
|---|---|---|---|
| 4,624,358 | 11/1986 | Satou | 29/759 X |
| 4,683,644 | 8/1987 | Tange et al. | 29/740 X |
| 5,070,916 | 12/1991 | Biesecker | 140/105 |
| 5,134,034 | 7/1992 | Miyamoto | 140/105 |
| 5,307,555 | 5/1994 | Eder et al. | 29/566.3 |
| 5,361,486 | 11/1994 | Harmsen et al. | 29/563 |

FOREIGN PATENT DOCUMENTS

| | | | |
|---|---|---|---|
| 0222401 | 5/1987 | European Pat. Off. . | |
| 11345 | 1/1980 | Japan | 29/827 |
| 115532 | 7/1984 | Japan | 29/827 |
| 65461 | 4/1986 | Japan | 29/827 |
| 62-124033 | 6/1987 | Japan . | |
| 143225 | 6/1989 | Japan | 29/827 |
| 212654 | 3/1990 | Japan . | |
| 370165 | 3/1991 | Japan . | |
| 359774 | 9/1991 | Japan . | |
| 3268349 | 11/1991 | Japan . | |
| 468541 | 3/1992 | Japan . | |
| 5050171 | 3/1993 | Japan | 29/827 |
| 5152479 | 6/1993 | Japan . | |

Primary Examiner—William R. Briggs
Attorney, Agent, or Firm—Sughrue, Mion, Zinn, Macpeak & Seas

[57] ABSTRACT

An improved lead working machine has a mechanism portion that supplies a leadframe 100, a working and handling portion that performs the necessary working processes on the work as it is fed consecutively, and a receiving mechanism portion that receives the worked products. A plurality of dies 40 and 42 for performing working processes including resin removal, dam bar cutting and lead forming, etc. are provided in tandem in the working and handling portion such that the direction of the working line of the first die 40 aligns with that of the subsequent die 42. A rail mechanism for guiding the lateral edge portions of the leadframe to be transported from the first die 40 to the subsequent die 42, as well as a pickup mechanism, by which a piece part that has been obtained by separating the product portion of the leadframe 100 in the first die 40 is picked up and transported to the subsequent die 42, are provided in positions intermediate between the dies 40 and 42.

15 Claims, 12 Drawing Sheets

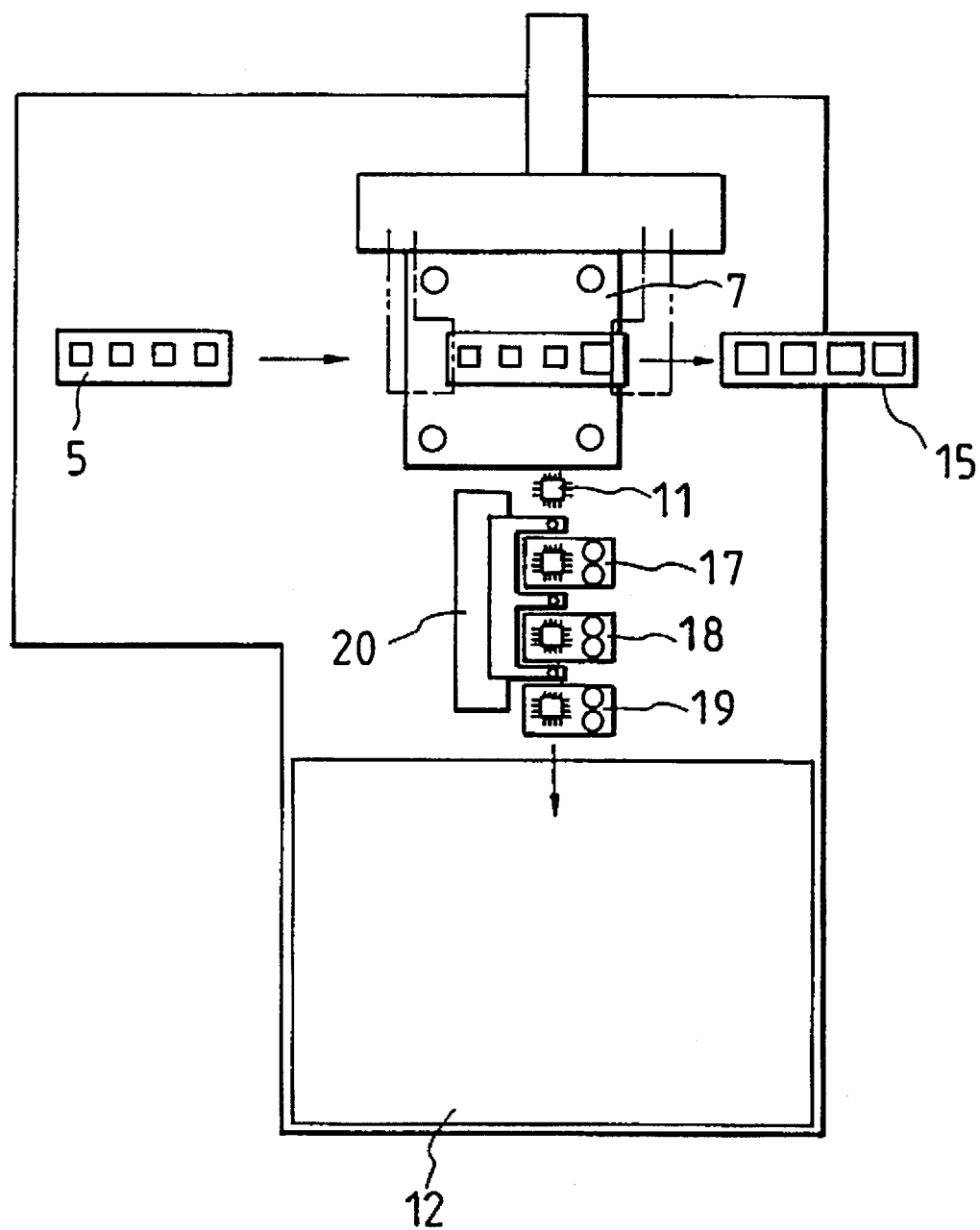

GENERAL-PURPOSE LEAD WORKING MACHINE

BACKGROUND OF THE INVENTION

1. Field of the Invention

The present invention relates to a general-purpose lead working machine for performing various working processes such as lead forming in the fabrication of semiconductor devices.

2. Description of the Related Art

The fabrication of plastic-molded semiconductor devices includes the steps of placing semiconductor chips on leadframes, molding them with plastic and performing the necessary working processes such as resin removal, dam bar cutting, lead tip cutting and lead forming. The lead working machine is used at this post-molding processing stage to perform lead forming and various other working steps.

The lead working machine is usually operated with more than one die. The working operation is performed in two different ways: in one case, the leadframe is worked as it is transported in strip form and piece parts are separated from it at the final stage, and in the other case, lead cutting and dam bar cutting are first conducted and then the product portions are separated as piece parts from the leadframe and transported to the bending step. The primary reason for adopting these two different methods of transport is as follows: in the case where the leadframe is transported in a strip form, a simple transport apparatus will do since the top and bottom rails of the leadframe can be utilized as transport guides; however, with product portions that are not suspended from the top and bottom rails by means of hanger pins (i.e., pinch leads for suspending the packages) or with products that are suspended by means of hanger pins but which may drop during transport owing to the insufficient strength of the pins, transport of the leadframe for bending or otherwise working the leads is sometimes impossible unless it is separated into piece parts.

FIGS. 19, 20 and 21 are illustrations showing the layout of a prior art lead working machine. FIG. 19 shows an apparatus that performs working processes up to the bending stage as a leadframe in a strip form is fed consecutively with pins inserted into the rail holes in the leadframe. In this apparatus, the leadframe generally indicated by 5 is worked as it is supplied from the left side of the apparatus into a first die 7 and a second die 8 on a platform 6. A feed unit 10 which allows the leadframe to be fed consecutively with pins inserted into the rail holes is positioned parallel to the train of dies. In the final step following the bending process, piece parts 11 are separated, transported from the second die and placed in a receiving portion 12. The unwanted frame which remains after the separation of piece parts 11 is directly ejected from the second die to fall free. Depending on the relationship between the number of working processes and the number of chips on the leadframe, three or more dies may be arranged side by side for working the leads.

The working machine shown in FIG. 19 is useful with DIP, ZIP, SOJ, PLCC and all other products that have hanger pins. It is particularly suitable for use with TSOPs, where it is difficult to effect precise positioning with reference to the lateral sides of the thin packages into which the leadframe has been separated.

FIG. 20 shows a working machine that has a first die 7 and a second die 8 arranged in a direction normal to the supply of the leadframe 5. In the first die 7, the leadframe is transported as while working processes such as dam bar cutting and lead tip cutting are effected and, at the final stage, the leadframe piece parts are separated from the leadframe; the piece parts then leave the first die 7 in an orthogonal direction and enter the second die 8, through which the piece parts are fed consecutively for further working. In the second die 8, the piece parts are fed consecutively by sliding them over the die by means of a feed bar 14 so that the leads are bent successively and thereafter placed in the receiving portion 12. The unwanted frame 15 is directly ejected from the first die 7. A feed bar transport unit 16 is located parallel to the second die 8.

The working machine shown in FIG. 20 is useful with DIP, ZIP, SOJ, SOP and other products that have outer leads attached in one or two directions. Because of the structural design of the bending die, this type of working machine allows for precise positioning by lateral movement and, hence, it is especially suitable for use with SOP and SOJ.

FIG. 21 shows a case in which the leadframe is transported through a first die while working processes such as dam bar cutting and lead tip cutting are carried out and, at the final stage, piece parts 11 are separated from the leadframe; thereafter the piece parts 11 emerge from the first die 7 in a direction normal to the transport through said die and are successively transported by suction to pass through a second die 17, a third die 18 and a fourth die 19 for working the leads. For transporting the piece parts 11 between successive dies, a suction transport unit 20 is provided parallel to the second die 17, third die 18 and fourth die 19. The apparatus shown in FIG. 21 requires as many dies as the steps of the bending process.

The working machine shown in FIG. 21 is useful with QFP, PLCC and other products that have outer leads attached in four directions. It is particularly suitable for use with QFP and PLCC, which are large packages that may drop while they are transported, because they are engaged by means of hanger pins.

As is apparent from the foregoing description, the conventional lead working machines perform the intended operations with a suitable method of transport being selected in accordance with the type of product to be yielded. For example, TSOP is suitably transported on a leadframe basis; SOP and SOJ are suitably transported by means of a feed bar; and QFP and PLCC are suitably transported by suction. Therefore, different types of products have to be worked by machines that are adapted for the respective types. However, providing separate working machines for different types of products is very disadvantageous from the viewpoint of manufacturing cost and, in addition, with the recent trend in the semiconductor industry toward the fabrication of many kinds of products in small lots, there has been a growing need for general-purpose working machines that are adaptable for common use in the working of different types of products.

SUMMARY OF THE INVENTION

The present invention has been made under these circumstances and an object of the invention is to provide a general-purpose working machine which is easy to handle and that is adaptable for common use in the working of different types of products by two varying methods, one method being that a leadframe is fed consecutively for working and the other being that piece parts are fed consecutively for working.

The above-mentioned object of the invention has been attained by a general-purpose lead working machine having a leadframe supply mechanism portion for supplying a plastic-molded leadframe to be worked in a strip, piece-part or hoop form; a working and handling portion for performing the necessary working processes on the leadframe as it is fed consecutively; and a receiving mechanism portion for receiving the worked products. This lead working machine comprises a plurality of dies for performing the necessary working processes including resin removal, dam bar cutting, lead tip cutting, lead forming, etc. provided in tandem in said working and handling portion such that the direction of the working line of one of said dies aligns with that of the subsequent die; a rail mechanism for guiding the top and bottom rails of the leadframe to be transported from one of said dies to the subsequent die provided in a position intermediate between the two dies; and a pickup mechanism by which a piece part that has been obtained by separating the product portion of the leadframe in one of said dies is picked up and transported to the subsequent die provided in a position intermediate between the two dies.

In one embodiment of the invention, the general-purpose lead working machine has a control portion that permits selective use of said rail mechanism or said pickup mechanism.

In another embodiment, said rail mechanism is provided with an ejector chute for ejecting the unwanted frame which results from the separation of piece parts from the leadframe in one of said dies, said chute provided in a position intermediate between said one die and the subsequent die but in line with said one die such that it is vertically movable between a retracted position which is below the position of the height for the transport of the work and an upper position at which the unwanted frame is admitted.

In still another embodiment, said rail mechanism has a pair of moving rails that guide the top and bottom rails of the leadframe and which are supported such that they are variable in the direction of width, and a drive mechanism for adjusting the distance between said moving rails (the width) in accordance with the type of leadframe to be worked.

In a further embodiment, said pickup mechanism has a pickup portion for supporting a piece part that has been separated from the leadframe in one of said dies, and a replacement actuating portion that moves said pickup portion from said one die to the subsequent die and by which the piece part supported by said pickup portion is placed on the subsequent die.

In a still further embodiment, said replacement actuating portion has a rotating plate mounted rotatably above a position intermediate between one of said dies and the subsequent die (said rotating plate having a pickup portion in two positions, one being located above the exit end of said one die from which the piece part is transported and the other being located above the entrance end of the subsequent die to which the piece part is transported) and a rotation drive portion that causes said rotating plate to turn by 180° for every replacement action so that the piece part supported by said pickup portion is moved from said one die and placed on the subsequent die.

In yet another embodiment, the working machine is capable of selecting either the method in which the piece part, in response to the 180° turn of the rotating plate, is moved from said one die and placed on the subsequent die in the same direction as it was at the exit end of said one die from which it was being transported, or the method in which said piece part is moved and placed 90° offset from the direction in which it was at said exit end.

In another embodiment, moving parts including feed arms for consecutive feeding of the work on the dies are mounted on each of said dies and a feed drive mechanism for advancing or retracting the moving parts mounted on said dies is provided beside each of the positions in the working and handling portion where the individual dies are located and said feed drive mechanism and said moving parts are provided such that they are operatively associated when said dies are set in the working and handling portion.

In a further embodiment, the feed drive mechanism for driving said dies is capable of driving the individual dies independently of one another.

In a still further embodiment, said feed drive mechanism consists of a pushing mechanism which pushes the moving parts on each die in an advancing direction and a retracting mechanism by which the moving parts that have been advanced by said pushing mechanism are moved back to their initial position and either said pushing mechanism or said retracting mechanism is adapted to be driven by means of a ball screw.

In another embodiment, the dies in said working and handling portion are selected from among dies that depend on the transport of the leadframe, dies that depend on the transport of a piece part by suction, and dies that depend on the transport of a piece part by means of a feed bar.

In yet another embodiment, each of the dies in said working and handling portion is furnished with a memory portion loaded with a working program predetermined for the specific work to be processed in said dies and, in response to the setting of said die in the working and handling portion, said working schedule is read automatically in a control drive portion in the main body of the working machine, whereupon the rail mechanism, the pickup mechanism and other portions are controlled in accordance with said working schedule to perform the necessary working processes.

When the leadframe is transported from one of the dies to the subsequent die, the transfer is effected as the top and bottom rails of the leadframe are guided by the rail mechanism. When piece parts are separated from the leadframe in one of the dies for placement on the subsequent die, the piece parts transported from said one die are individually picked up by the pickup mechanism and placed on the subsequent die.

The unwanted frame which remains after separation of the individual piece parts on said one die is placed into the ejector chute at the ejection end.

The pickup portion of the pickup mechanism picks up a piece part at the exit end of said one die from which said piece part is being transported and the replacement actuating portion moves said piece part supporting pickup portion so that said piece part is placed on the subsequent die. If the rotating plate is used, it is turned 180° so that the piece part is picked up from said one die and placed on the subsequent die.

In response to the setting of dies in the working and handling portion, the feed drive mechanism provided in the working and handling portion allows the moving parts on each die to either advance or retract so that the work is fed consecutively on the dies. If an advancing or retracting mechanism that depends on a ball screw for driving is provided for the feed drive mechanism, the moving parts can be stopped in a desired position in the advancing or retracting mode.

Dies that depend on the transport of the leadframe or dies that depend on the transport of a piece part by suction or dies that depend on the transport of a piece part by means of a feed bar may be set in the working and handling portion to enable flexible use of the machine in working various types of products.

BRIEF DESCRIPTION OF THE DRAWINGS

The present invention will be described in more detail with reference to the accompanying drawings, in which:

FIG. 21 is an illustration showing the construction of yet another prior art lead working machine.

DETAILED DESCRIPTION OF THE PREFERRED EMBODIMENTS

The general-purpose lead working machine according to embodiments of the present invention will be described below in more detail with reference to the accompanying drawings.

General layout of the machine

Figure 1:
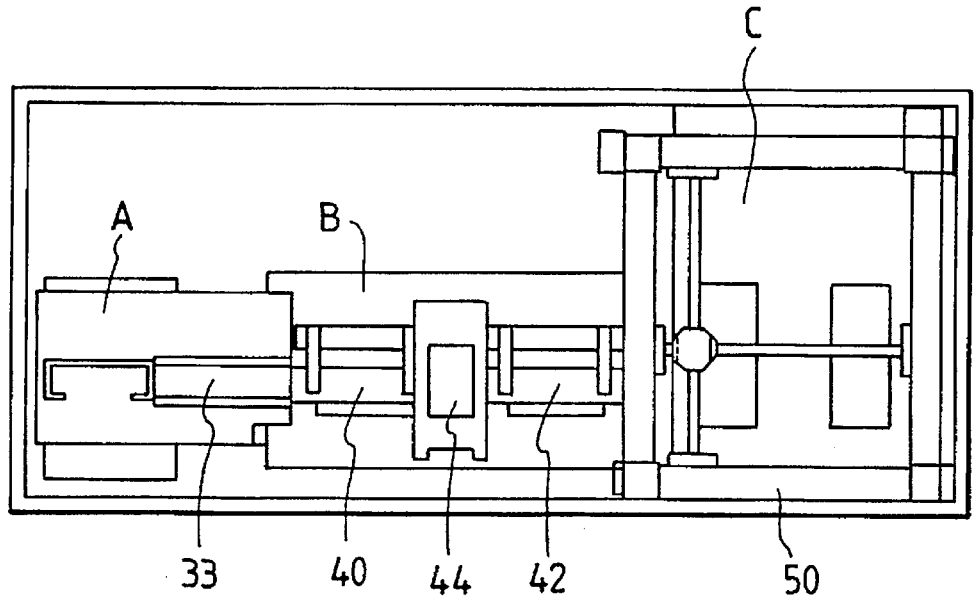
FIG. 1 is an illustration showing the layout of various parts of the general-purpose lead working machine of the invention as it is seen from above.
Figure 2:
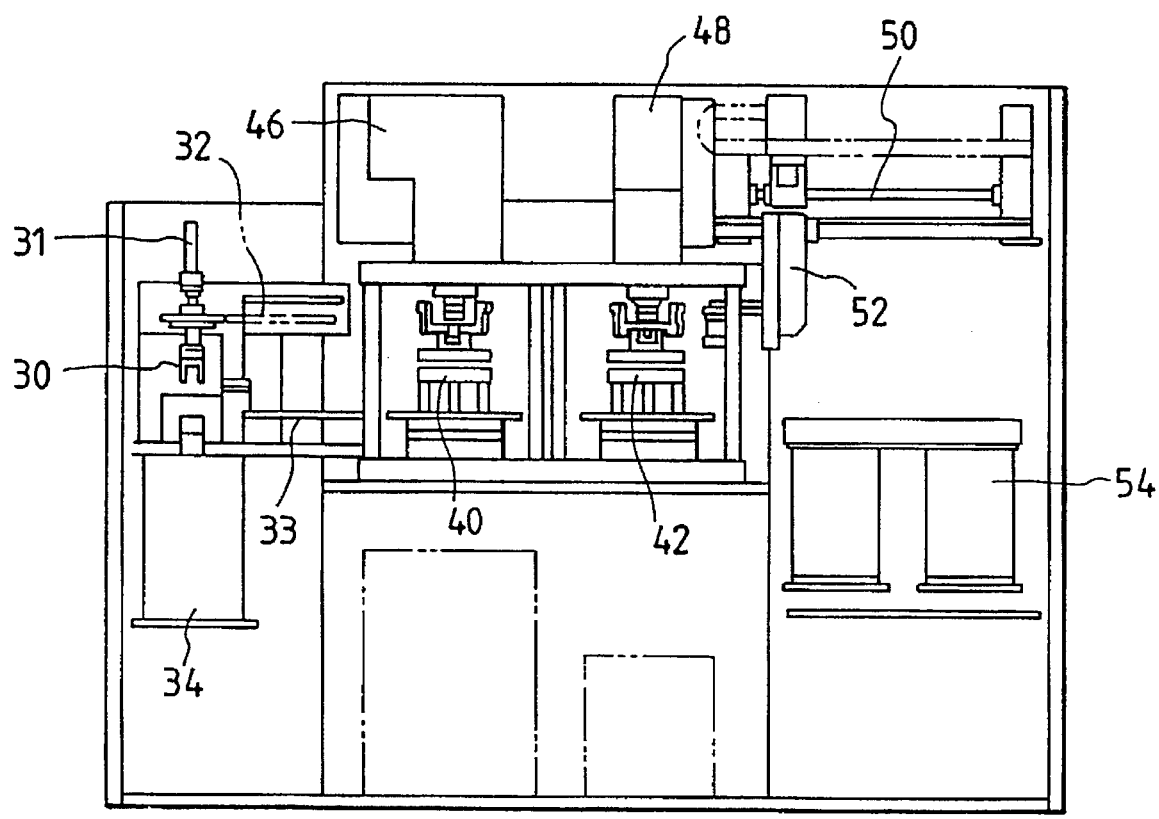
FIG. 2 is an illustration showing the layout of various parts of the general-purpose lead working machine of the invention as it is seen from the front.

FIGS. 1 and 2 are illustrations showing the general layout of the lead working machine of the invention. FIG. 1 is a top view and FIG. 2 is a front view. The working machine of the embodiment under consideration consists basically of a leadframe supply mechanism portion A for supplying a plastic-molded lead frame to working stages, a working and handling portion B for working the leadframe, and a receiving mechanism portion C for receiving the worked product.

The leadframe supply mechanism portion A, the working and handling portion B and the receiving mechanism portion C are arranged in a row and the work is supplied from A to B, where it is subjected to the necessary working processes, and the worked products are received in C.

In the leadframe supply mechanism portion A, plastic-molded leadframes stacked in a magazine are chucked one by one and placed in a predetermined position in the working and handling portion B. The leadframes in the magazine are pushed up with a lifter under the magazine in synchronism with the chucking action and are thereafter supplied successively to the working and handling portion B, with the topmost leadframe supplied first and the underlying frame supplied next.

Referring to FIG. 2, numeral 30 designates the chuck, 31 a cylinder for vertically moving the chuck 30, 32 a belt for moving the chuck 30 laterally or horizontally, 33 a pair of rails along which the leadframe is moved, and 34 a magazine support.

Since the length and width of the leadframes depend on the product to be yielded, the magazine for accommodating the leadframes also varies in size. To insure flexible use for magazines of varying sizes, the leadframe supply mechanism portion A of the embodiment under consideration permits the magazine to be set in such a way that the centers of the width and length of each leadframe in the magazine coincide with the center of the chuck 30 and, at the same time, the supply mechanism portion A is so adapted that each leadframe can be moved along the rails 33 as it is chucked in the central position. The distance between the rails 33 is variable with the width of each leadframe and the leadframe can be supplied to the working and handling portion B with the position of the center of the width of the leadframe being used as a reference point.

In the working and handling portion B, the leadframe as supplied from the supply mechanism portion A is subjected to the predetermined working processes as it is fed consecutively to the respective working stages. In the embodiment under consideration, the first die 40 is positioned the closer to the leadframe supply end and the second die 42 is positioned a certain distance away from the first die 40. The first die 40 and the second die 42 are set in a press unit in a free-shank fashion so that they can be independently mounted or dismounted from the press unit. The first die 40 and the second die 42 may be of either the type that permits the leadframe to be worked as it is fed consecutively in a strip form or the type that permits piece parts to be worked as they are fed consecutively. The structural design that enables either type of dies to be set in the press unit will be described later in this specification.

To insure that working is performed irrespective of whether the work being fed consecutively is the leadframe in a strip form or piece parts which have been separated from the leadframe, the working and handling portion B of the embodiment under consideration includes the following three members which are positioned intermediate between the first die 40 and the second die 42: a rail mechanism 33 for transferring the leadframe to the second die 42, an ejector chute 44 into which the unwanted frame is ejected from the first die 40, and a pickup mechanism by which the piece parts that have been separated from the leadframe in the first die 40 are moved and placed on the second die 42.

Referring to FIG. 2, numeral references 46 and 48 designate press subunits for driving the first die 40 and the second die 42, respectively.

The products that are ejected after the predetermined working processes have been completed in the working and handling portion B are successively placed into receiving trays in the receiving mechanism portion C. In the embodiment under consideration, an X-Y drive stage 50 supports by suction the products being ejected from the second die 42 and places them in the receiving tray. Referring to FIG. 2, numeral 52 designates a receiving pickup head as mounted on the X-Y drive stage 50, and 54 represents the receiving trays for receiving the ejected products. The receiving trays 54 are set in the working machine as they are stacked in carriers and the individual products are placed in alignment by means of the X-Y drive stage 50 as they are set one by one in the receiving position.

As described above, the lead working machine of the embodiment under consideration comprises the leadframe supply mechanism portion A, the working and handling portion B and the product receiving mechanism portion C, arranged in tandem in such a way that the work is subjected to the necessary working processes as it is transported linearly from the position where it is supplied to the portion A up to the position where the worked product is taken up from the portion B. Because of this arrangement, the lead working machine is compact and convenient to use since all handling procedures such as setting the work in the dies, mounting the dies and dismounting them can be effected on the side of the machine that faces the operator. The lead working machine of the embodiment under consideration is basically intended for working leadframe strips but it should be understood that the working and handling portion B is also applicable to a hoop leadframe or piece parts with minimum alterations being made to the supply and receiving ends of the machine.

Layout of the working and handling portion

The general-purpose lead working machine of the embodiment under consideration has the first die 40 and the second die 42 arranged in tandem and is capable of working leads regardless of whether the leadframe is fed consecutively or whether piece parts that have been separated from the leadframe are fed consecutively. This is made possible by the special layout of the working and handling portion B, which is described below in detail.

Figure 3:
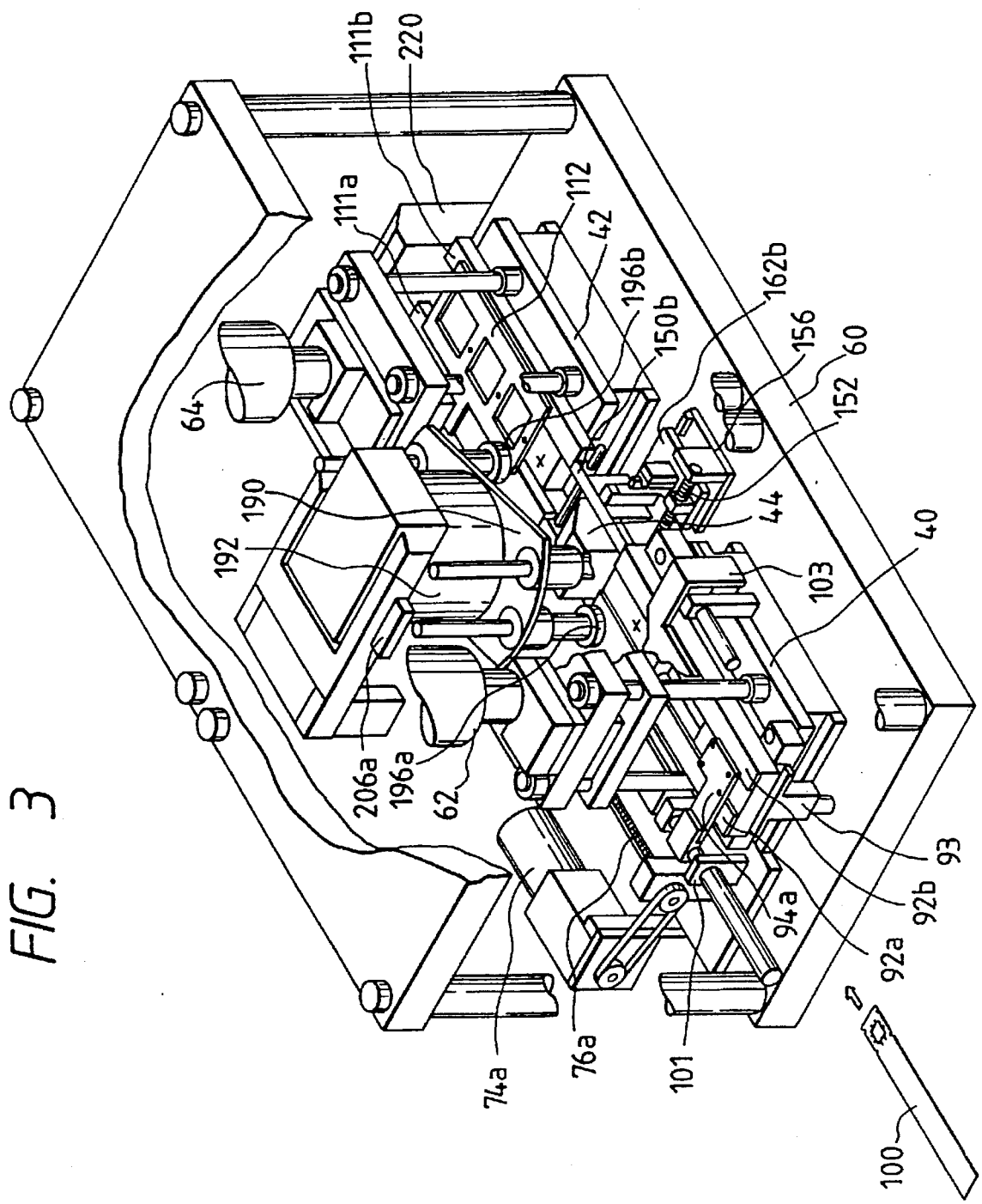
FIG. 3 is a perspective view of the working and handling portion of the machine.

FIG. 3 is a perspective view of the working and handling portion B. The first die 40 and the second die 42 are set on the base 60 of the press unit and are brought into engagement with independently driven press rams 62 and 64, respectively, in a free-shank fashion. If the first die 40 and the second die 42 are inserted into the machine from the side facing the operator and thereafter pushed to slide over the base 60 toward the other side of the machine, the dies are brought into engagement with the rams 62 and 64, respectively, so that they are in the driven state. The as-set die dimensions and the position of the height of the engagements with the press rams 62 and 64 are common to the two dies, so that die units including the worked products can be replaced and set, as required, in the working and handling portion B.

The embodiment under consideration assumes that the first die 40 is capable of working the leadframe as it is fed consecutively whereas the second die 42 is capable of working piece parts as they are fed consecutively. Each of the first die 40 and the second die 42 has a plurality of working stages and the work is fed consecutively to the respective working stages for effecting the necessary working processes. The work can be transported by either one of the following three methods: the leadframe is fed consecutively by means of a feed arm furnished with feed pins; piece parts are fed consecutively as they are sucked with suction pads; and piece parts are fed consecutively as they are placed in pockets in a feed bar.

The feed arm allows the leadframe to be fed in given increments as it moves back and forth by one pitch on each working stage. When transporting the leadframe, exact positioning is obtained by inserting feed pins into the holes made in the rails of the leadframe. In the other cases of transport, i.e., the case where piece parts are held with suction pads and the case where they are placed in the pockets in the feed bar, the piece parts are fed consecutively through incremental movements by one pitch.

The pitch of feed on the dies varies with the type of product to be yielded, so in order to insure that the working machine can be used for various types of dies, feed by the required pitch must be realized for every die that is set on the machine. To this end, the embodiment under consideration is so designed that feed arms and other moving parts for use in the transport of the work are provided on the dies in accordance with the dimensional sizes of the product whereas a feed drive mechanism for reciprocating these moving parts is provided on the main body of the machine.

Work feed drive mechanism

Figure 4:
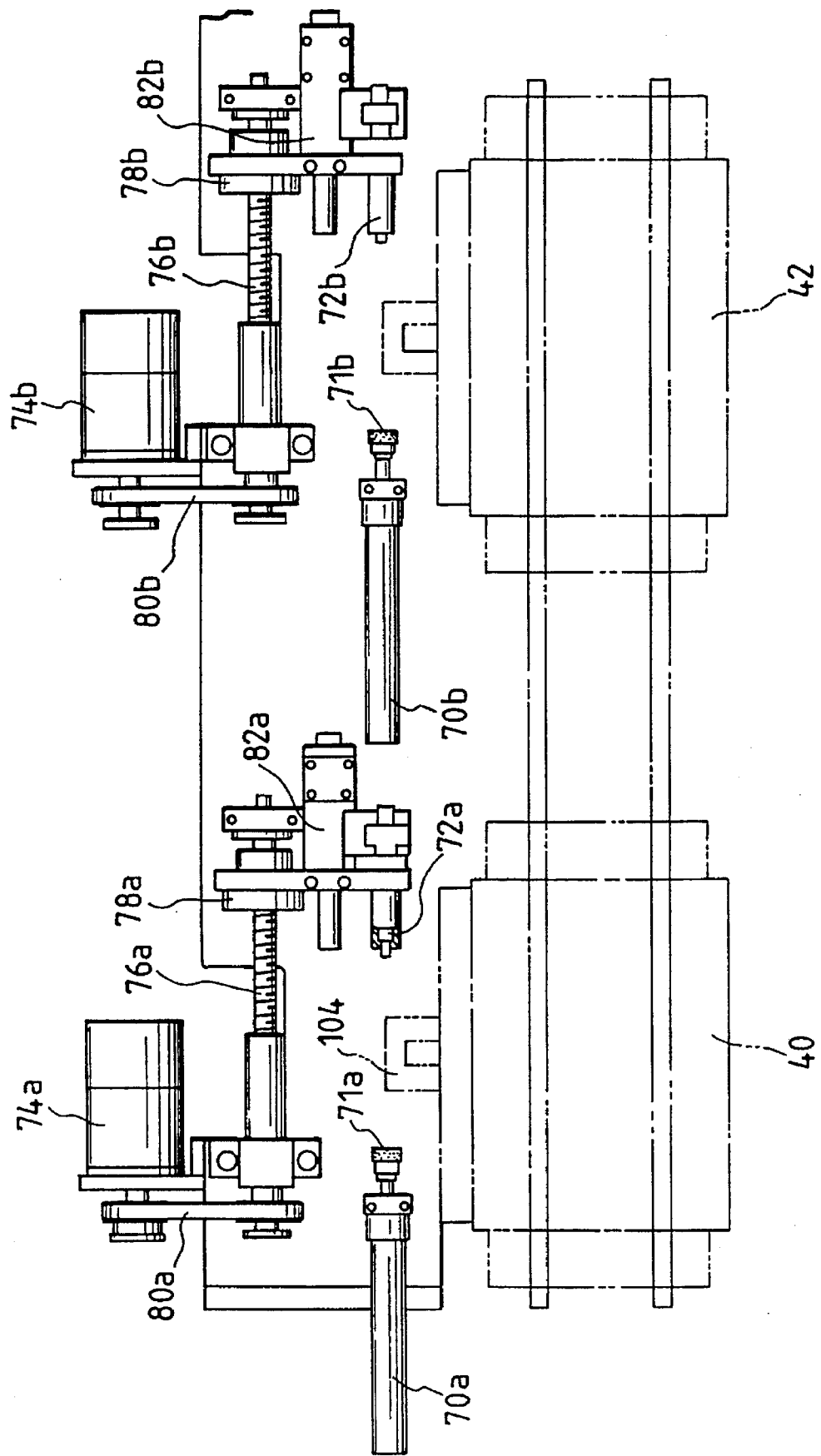
FIG. 4 is an illustration showing the construction of the feed drive mechanism provided in the main body of the machine.

FIG. 4 shows the feed drive mechanism as it is mounted on the base 60. The feed drive mechanism consists of two independent units for the first die 40 and the second die 42, respectively. To insure common use with various dies that depend on transport by different methods, the two units of the feed drive mechanism have a common layout so that a desired die can be substituted for each of the dies 40 and 42. The two units of the feed drive mechanism as provided on the respective dies are controlled such that they are synchronously driven.

To insure that the feed arm and other moving parts which are provided on the dies will reciprocate in a direction parallel to the transport of the work, the feed drive mechanism has the capability of pushing those moving parts both in a direction in which they are advanced parallel to the transport of the work and in a direction in which they are moved back.

Referring to FIG. 4, numerals 70a and 70b designate cylinders for pushing the moving parts in the first die 40 and the second die 42, respectively, in an advancing direction, and 72a and 72b are pushers that push the same moving parts in a retracting direction. The pushing rod of the cylinder 70a (or 70b) is positioned at the same height as the pusher 72a (or 72b) in a face-to-face relationship with the latter. The distal end of the pushing rod of the cylinder 70a (or 70b) is fitted with a pad 71a (or 71b) that provides a cushion effect for the moving parts when they are pressed into contact with the rod; the pushers 72a and 72b are designed as shock absorbers.

The pushers 72a and 72b are pushed as they are driven with motors in combination with ball screws. In FIG. 4, numerals 74a and 74b refer to motors, 76a and 76b are ball screws, and 78a and 78b are nuts that mesh with the ball screws 76a and 76b, respectively. The ball screw 76a (or 76b) is operatively associated with the motor 74a (or 74b) by means of a belt 80a (or 80b), and the nut 78a (or 78b) is coupled to the pusher 72a (or 72b) via a slide guide 82a (or 82b). The slide guide 82a (or 82b) helps move the pusher 72a (or 72b) in a direction parallel to the transport of the work. The ball screw 76a (or 76b) is provided such that its axis is parallel to the slide guide 82a (or 82b).

As mentioned above, the work feed drive mechanism comprises drive means such as cylinders 70a and 70b, pushers 72a and 72b, and motors 74a and 74b. For consecutive feeding of the work, the feed arm and other moving parts are pushed by the cylinder 70a (or 70b) until they contact the pusher 72a (or 72b) whose position is controlled by means of the motor 74a (or 74b). This is how the feeding of the work is controlled.

To have the moving parts return to their initial position, the pusher 72a (or 72b) is driven by the motor 74a (or 74b) in the retracting direction. Thus, the work can be fed consecutively by actuating the cylinder 70a (or 70b) in association with the motor 74a (or 74b).

The feed drive mechanism used in the embodiment under consideration depends, for its operation, on motors using ball screws 76a and 76b. The advantage of driving the pushers 72a and 72b with the ball screws 76a and 76b is that the positions of the pushers 72a and 72b can be controlled such that the work can be stopped in the correct position during transport. More specifically, the position of the pusher 72a (or 72b) can be set by controlling the turning of the ball screw 76a (or 76b), so when advancing the moving parts on the dies by means of the cylinder 70a (or 70b), the work can be fed in increments which are fractions of the total range of transport by setting the pusher 72a (or 72b) at part of its stroke. The same can be accomplished in the return path of the pusher 72a (or 72b) by setting it at part of its stroke. It should also be mentioned that the layout of the cylinder 70a (or 70b) and the ball screw 76a (or 76b) that is driven by the motor may be reversed from the case of the embodiment under consideration. Since stoppers are provided on the dies, the ball screws 76a and 76b may be replaced by a belt or a rack-and-pinion mechanism, although these are somewhat rough methods of driving.

Exemplary layout of the first die

Figure 5:
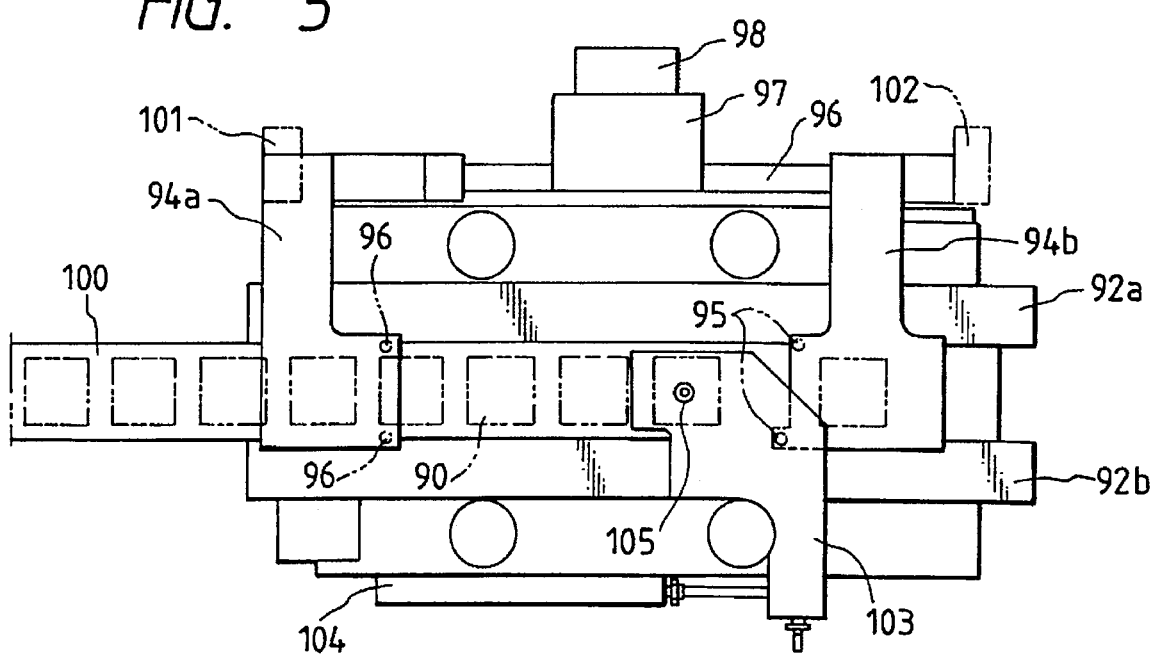
FIG. 5 is a plan view showing the structure of the first die.

FIG. 5 is a plan view of the lower part of the first die 40. The cavity surface of this lower part is provided with a plurality of working stages 90. The lower part is also provided with a pair of feed plates 92a and 92b that extend along both sides of each working stage 90 for transferring the leadframe as they guide the top and bottom rails of the leadframe. The plastic-molded leadframe 100 is supplied from one end of the first die 40 such that the edges of the leadframe's top and bottom rails are inserted into grooves that extend the entire length of the opposing inner lateral sides of the feed plates 92a and 92b. It should be noted here that a descending mechanism is provided at both ends of the feed plate 92a (or 92b) and this forces the feed plate 92a (or 92b) to be pushed down during press working.

Feed arms 94a and 94b cause the leadframe 100 to be fed consecutively to the lower part of the first die 40. To avoid interference with the working stages, the feed arm 94a is provided at the end where the leadframe 100 is admitted whereas the feed arm 94b is provided at the end where the leadframe 100 is ejected. The underside of the feed arm 94a (or 94b) is provided with erect feed pins 95 that face down in registry with the positions where holes are made in the top and bottom rails of the leadframe 100. When feeding the leadframe 100 consecutively, the feed pins 95 engage the holes in the top and bottom rails of the leadframe 100 and by transporting the leadframe in that way, it can be fed consecutively from one working stage 90 to the subsequent working stage.

The feed arms 94a and 94b are fixed to a connecting bar 96 with their spacing being set appropriately for each product. A plate 97 for holding the arms horizontally is secured to the connecting bar 96 and supported by a slide guide that is fitted on the outer lateral surface of the lower part of the first die 40. The slide guide serves to guide the feed arms 94a and 94b via the plate 97 so that they will reciprocate in a direction parallel to the feed of the leadframe 100. A butt block 98 projects from the outer lateral surface of the plate 97 to the deeper area of the machine. The block 98 is set in a position intermediate between the cylinder 70a and the pusher 72a (i.e., two elements of the work feed drive mechanism) and at the same height as these elements when the first die is set in a predetermined position on the base 60.

A stopper 101 restricts the retracted position of the feed arm 94a, and a stopper 102 restricts the advanced position of the feed arm 94b. The stoppers 101 and 102 are provided on the lower part of the first die 40 in such a way that they will contact the outer lateral surfaces of those base positions of the feed arms. The motion of stoppers 101 and 102 may be regulated either by shaping them in a plate form or by designing them as shock absorbers. By thusly specifying the positions where the stoppers 101 and 102 are to be set, the requisite stroke of the feed arms can be set for each die. It should be added that in the presence of stoppers on the die, the feed drive mechanism may be somewhat rough in design without causing any significant problem.

The cylinder 70a and the pusher 72a, which are two elements of the work feed drive mechanism, will reciprocate the feed arms 94a and 94b by alternately pushing two end faces of the butt block 98 in opposing directions. The movement of the feed arms 94a and 94b is regulated by the stoppers 101 and 102, respectively, so that the arms can be fed in given increments.

In the first die 40 used in the embodiment under consideration, the leadframe 100 is fed consecutively for the necessary working processes including resin removal, dam bar cutting and lead cutting and, thereafter, piece parts are separated from the leadframe. The separate piece parts are then moved for placement on the second die 42. To this end, the first die 40 is fitted with a mechanism for sucking the piece parts and transporting them toward the second die 42.

In FIG. 5, numeral 103 refers to a delivery arm for supporting each piece part by suction and ejecting it toward the second die 42. The delivery arm 103 is supported as guided along the lateral surface of the lower part of the first die 40 that is the closer to the operator so that it will reciprocate in a direction parallel to the feed of the feed arms 94a and 94b in operative association with an air cylinder 104. The front end of the delivery arm 103 extends to a position above the final working stage in the lower part of the first die 40 where piece parts are separated from the leadframe; the arm 103 has a suction pad 105 provided on the top surface for pneumatically sucking an individual piece part by suction.

To avoid interference with the feed arm 94b on the ejection side, the delivery arm 103 is capable of lateral movement slightly above the position of the arm 94b so that the piece part as supported by the arm 103 crosses over the arm 94b to get to the ejection side of the first die 40.

The upper part of the first die 40 is provided with a knock-out and a punch that help support the work between the upper and lower parts of the first die. The upper part of the first die is also furnished with a vertically movable rod as a means to insure that the piece part separated from the leadframe 100 is supported by suction; the rod has an air channel formed in the interior with a suction pad fitted at the lower end.

The product that has been separated as a piece part from the leadframe in the final working stage of the first die 40 is sucked pneumatically by the suction pad fitted at the end of the rod on the upper part of the first die 40, and the product ascends temporarily together with the upper part. The unwanted frame is transported by the feed arms 94a and 94b toward the ejection side. As the upper part of the first die 40 ascends, the delivery arm 103 gets into the first die from the ejection side and stops in a position just beneath the piece part supported by the upper part of the first die; thereafter, the rod on the upper part of the first die descends and releases the piece part, which is then sucked by the suction pad 105 on the delivery arm 103. The piece part, supported on the delivery arm 103 by suction, is taken out of the first die 40 by moving the arm 103 in the advancing direction by means of an air cylinder 104.

The sequence of working actions that are taken by the first die 40 may be outlined as follows. When the feed plates 92a and 92b are in the UP position, or when the leadframe 100 as supplied from the left side of the first die 40 is slightly apart from the die surface, the feed pins 95 engage the holes in the top and bottom rails of the leadframe, which is fed consecutively by the pushing action of the feed arms 94a and 94b which is effected by the cylinder 70a which is part of the feed drive mechanism. In a predetermined feed position of the leadframe, the feed plates 92a and 92b are driven to descend and the intended press working is done between the upper and lower parts of the first die. While the press working is done, the feed arms 94a and 94b are driven by the ball screw 76a which is another part of the feed drive mechanism, so that those arms are moved back to their initial positions, thus becoming ready for the next transport step.

As described above, the leadframe 100 is fed consecutively over the working stages and piece parts are separated from the frame at the final stage. The separate piece parts are carried by the delivery arm 103 and taken out of the first die toward the ejection side, whereas the unwanted frame keeps moving over the lower part of the first die toward the ejection side, from which it is discharged from the system.

The first die 40 used in the embodiment under consideration is of such a type that piece parts are separated from the leadframe in the final working stage. If the die 40 is of such a type that the product portions are not separated as piece parts from the leadframe, the latter will be transported in the initial strip form toward the second die 42. This type of die is not furnished with the delivery arm 103 for taking the piece part out of the die or any mechanism for allowing the upper part of the die to hold the piece part by suction. It should also be noted that if the second die is of this type, it is also not furnished with the delivery arm 103 or any mechanism for allowing the upper part of the die to hold the piece part by suction. However, if the second die is a type that accepts piece parts separated from the leadframe, the delivery arm 103 and the piece part sucking mechanism must be fitted.

Exemplary layout of the second die

Figure 6:
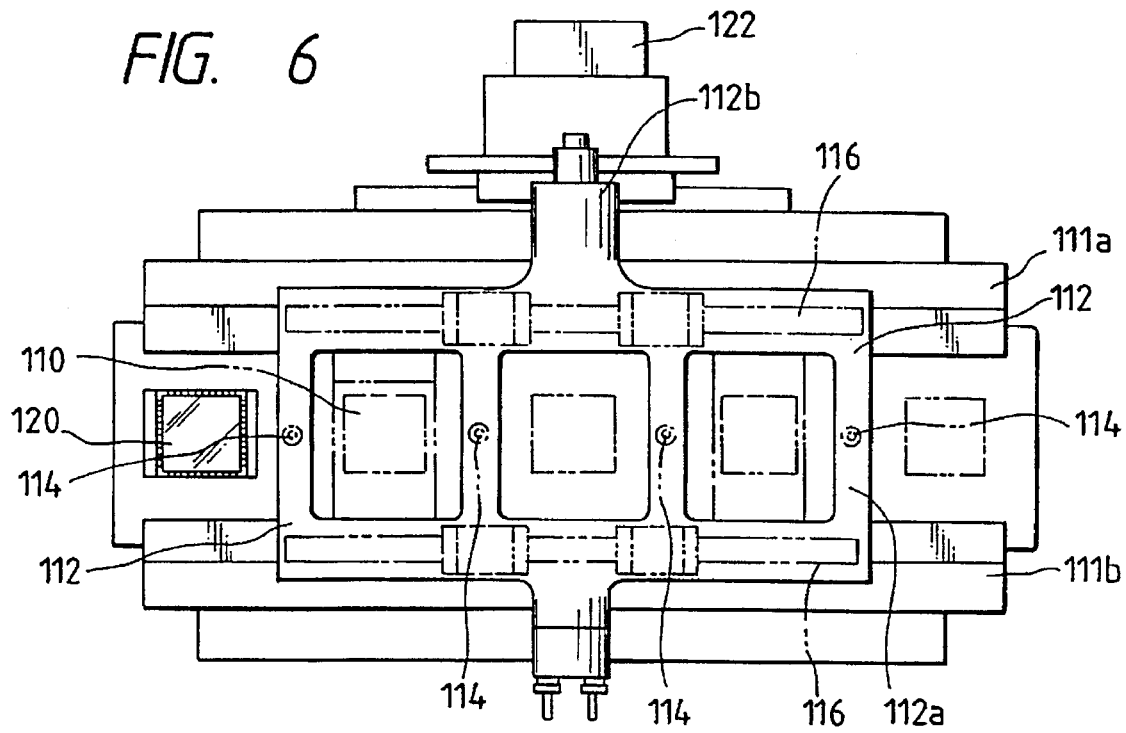
FIG. 6 is a plan view showing the structure of the second die.

FIG. 6 is a plan view of the lower part of the second die 42. Unlike the first die 40, the second die 42 is of a type that piece parts, obtained by separating the product portions from the leadframe, are fed consecutively one by one for working purposes.

Referring to FIG. 6, working stages 110 are provided in the lower part of the second die. In the embodiment under consideration, three working stages are provided. With a die like the first die 40 which performs work on the leadframe that is transported as such, the transport of the work is guided by feed plates. The second die 42 is also furnished with feed plates 111a and 111b but these are simply driven in a vertical direction and will by no means guide the work.

A piece part 120 as supplied to the entrance of the second die passes through the successive working stages to be processed. Each working stage 110 carries one piece part 120 and all piece parts are supported simultaneously by suction with suction pads and transported to the adjacent working stages 110. To avoid any inconveniences to the working operation in each working stage 110, the second die used in the embodiment under consideration is provided with a frame-like feed arm 112 that has rectangular openings in areas that correspond to the working stages 110 and the arm 112 is fitted with suction pads 114 that enable the simultaneous transport of the piece parts 120.

The feed arm 112 has a sliding portion on either side across the width of each working stage 110 and this sliding portion guides the feed arm 112 so that it will reciprocate in a direction parallel to the transport of the piece part 120. Support plates 112a are provided in such a way that they span the opposing sliding portions and their underside is fitted with suction pads 114 that face down. In the embodiment under consideration, four support plates 112a are provided and each of them is fitted with one suction pad 114. The suction pads 14 are individually connected to a negative-pressure aspirator such as a vacuum generator.

Figure 7:
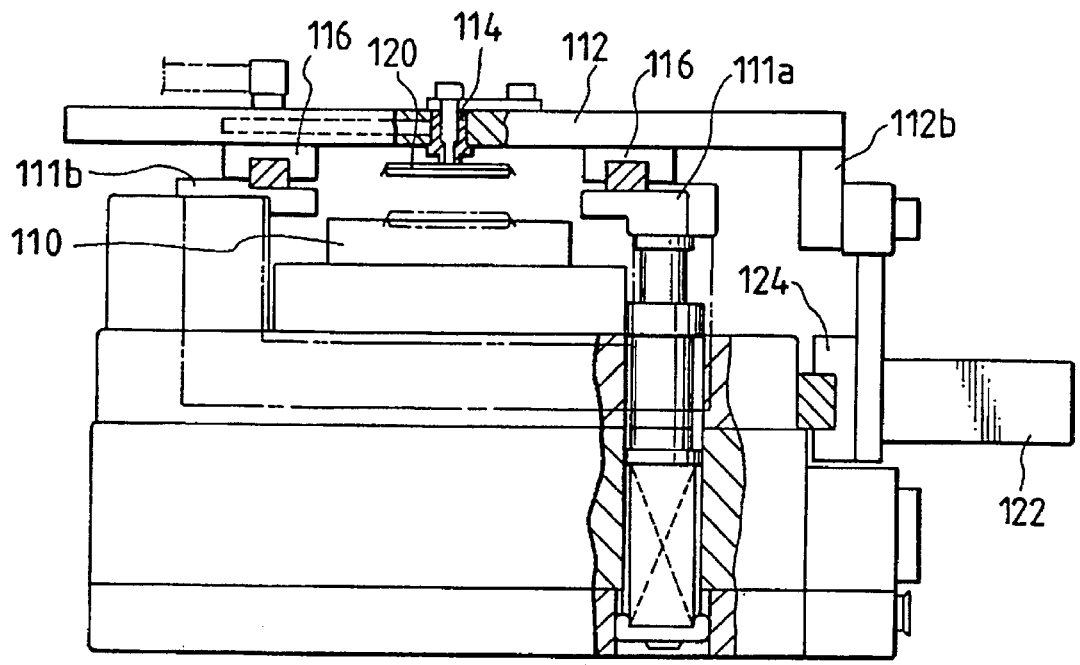
FIG. 7 is an illustration showing the portion where the feed arm is mounted on the second die.

The sliding portions of the feed arm 112 are supported by slide guides 116 that are provided on the feed plates 111a and 111b. FIG. 7 is a side view showing how the feed arm 112 is supported by the slide guides 116.

As in the case of the feed arms 94a and 94b fitted on the first die 40, the feed arm 112 is driven to reciprocate by means of a feed drive mechanism installed on the main body of the working machine. To this end, the feed arm 112 has a sub-arm 112b that extends away from the operator (toward the other side of the machine). At the same time, the end portion of the arm 112b extends downward along the outer lateral surface of the lower part of the second die and the lower end of the sub-arm 112b is fitted with a butt block 122 which faces outward. The butt block 122 is fitted in registry with the height of the cylinder 70b and the pusher 72b. For guided movement of the butt block 122, a slide guide 124 is fitted on the outer lateral surface of the lower part of the second die and it serves as a guide for supporting the butt block 122.

As shown in FIG. 7, the piece part 120 in the process of transport is sucked by suction pad 114 so that it is spaced by a certain distance from the surface of the working stage 110. When the piece part 120 moves to the subsequent working stage 110, the feed arm 112 descends and functions to place the piece part 120 on the subsequent stage 110.

To permit these actions, the feed plates 111a and 111b are supported by the lower part of the second die in such a way that they are vertically movable; at the same time, the feed plates are operatively associated with a vertically driving mechanism so that they can move in the vertical direction. It should be mentioned here that the feed arm 112 which is supported by the slide guide 124 for lateral movement is also guided by slides that allow for vertical movements by means of engagement through dovetail grooves.

The feed arm 112 is moved forward when the cylinder 70b installed on the main body of the working machine contacts the lateral surface of the butt block 122 and pushes it in the advancing direction whereas the feed arm is moved backward when the pusher 72b, also installed on the main body of the working machine, contacts the lateral surface of the butt block 122 and pushes it in the retracting direction. Such forward and backward movements create the reciprocating action of the feed arm 112. Therefore, by using stoppers to restrict the range over which the feed arm 112 can move, the requisite feed stroke can be set for the specific product type so as to permit the feeding of the arm in the required increments.

The sequence of working actions that are taken by the second die 42 may be outlined as follows. First, the piece part 120 is supplied to the lower part of the second die, whereupon the suction pad 114 in the farthest portion of the feed arm 112 moves back to the position that corresponds to the center of the top surface of the package of that particular piece part 120. The same is true with the piece parts 120 that are already at the respective working stages 110 (the suction pad 114 comes into registry with the central position of each piece part). With this registry kept, the feed plates 111a and 111b are lowered so that the individual piece parts 120 are sucked by suction pads 114. In the next step, the feed plates 111a and 111b are lifted and the feed arm 112 is fed by a given increment to a position that is distant by one pitch. In that position, the feed plates 111a and 111b are lowered and the suction pads 114 release the piece parts 120, which are placed on the adjacent working stages 110. It should be noted here that the feed plates 111a and 111b are urged upward and must be forced to descend by a drive mechanism such as the descending mechanism 93.

After placement, the piece parts 120 are subjected to press working. To this end, the feed arm 112 is moved backward by a certain distance so that the plates 112a supporting the suction pads 114 come into registry with the central positions of the respective stages 110. As a result of this movement, vacancies will form in areas that correspond to the working stages 110 and press working is effected by clamping the upper and lower parts of the second die.

After the working process is completed, the same procedure is repeated to perform the next feed cycle and, hence, the next working process. Thus, the feed arm 112 and other associated elements are controlled to effect continuous press working.

As shown in FIG. 3, the lead working machine of the embodiment under consideration has the first die 40 and the second die 42 arranged in tandem so that the working with the first die 40 is followed by the working with the second die 42. However, as described on the foregoing pages, the work feed drive mechanism provided on the main body of the working machine enables the transport process to be performed in each die and, hence, by insuring that the feed drive mechanisms acting on the two dies are controlled in operative association with each other, continuous working can be effected with the first die 40 and the second die 42.

In the working machine of the embodiment under consideration, the feed drive mechanism has the same structural design for the portions where the respective dies are to be set and this is to insure that different kinds of products can be fabricated with this machine by working with dies that are selectively used. As for the pitch of incremental feeding and other factors that are variable with product type, the necessary adjusting means are provided on the dies and this allows the machine of the embodiment under consideration to be flexibly used in the fabrication of different kinds of products.

Exemplary layouts of other dies

Figure 8:
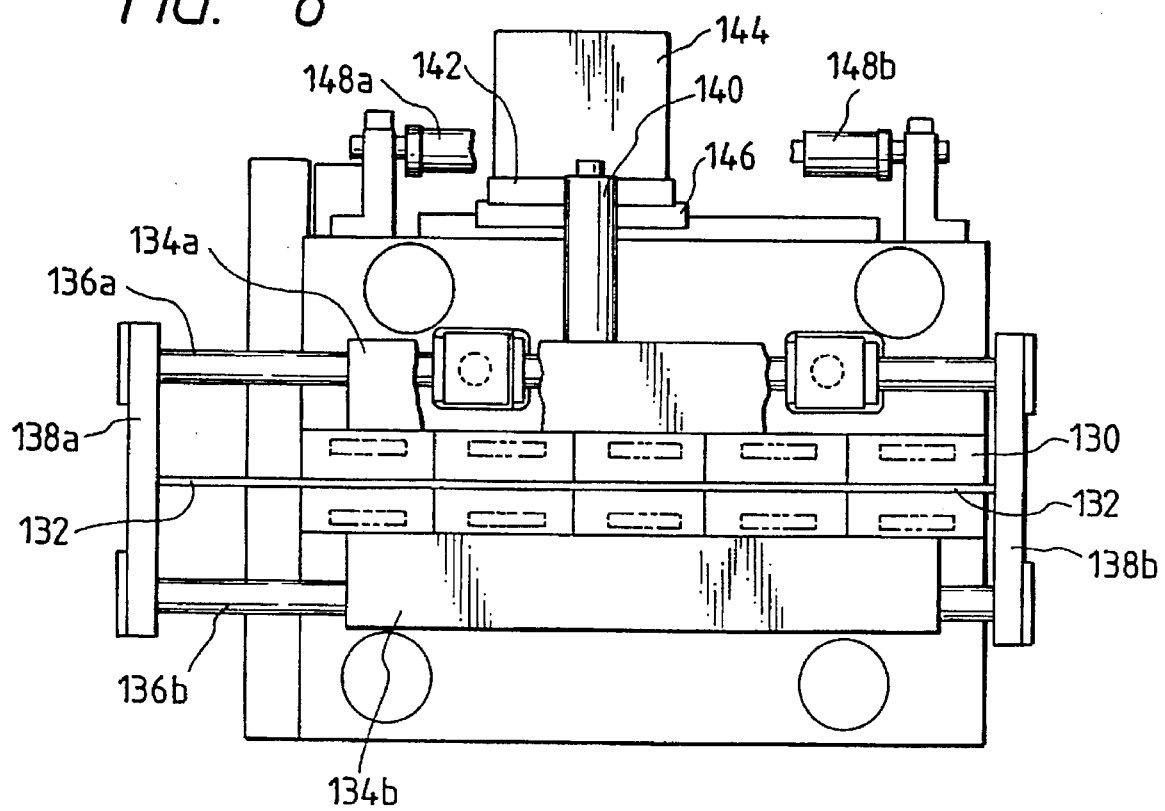
FIG. 8 is a plan view showing another exemplary die structure.
Figure 9:
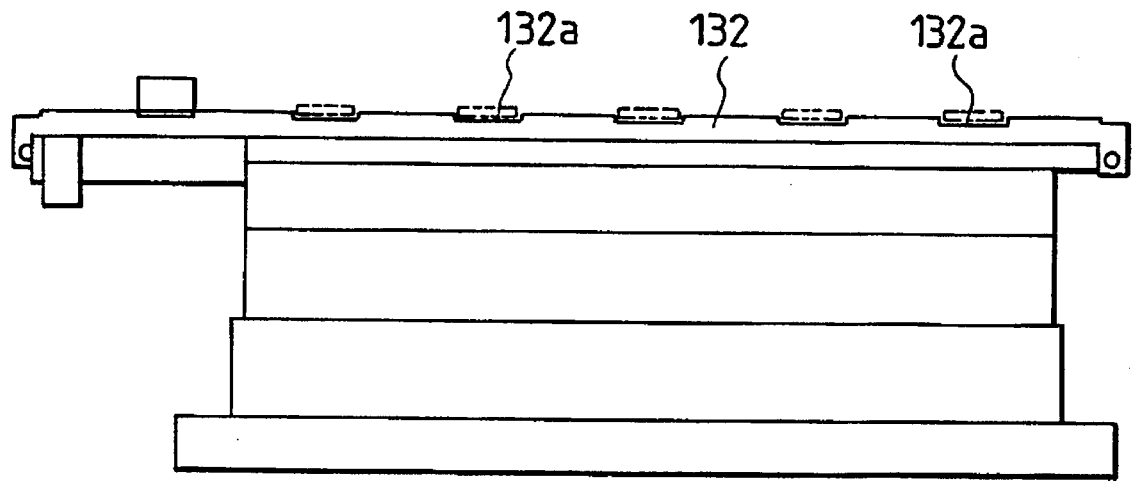
FIG. 9 is an illustration showing the construction of the feed bar used in the die shown in FIG. 8.
Figure 10:
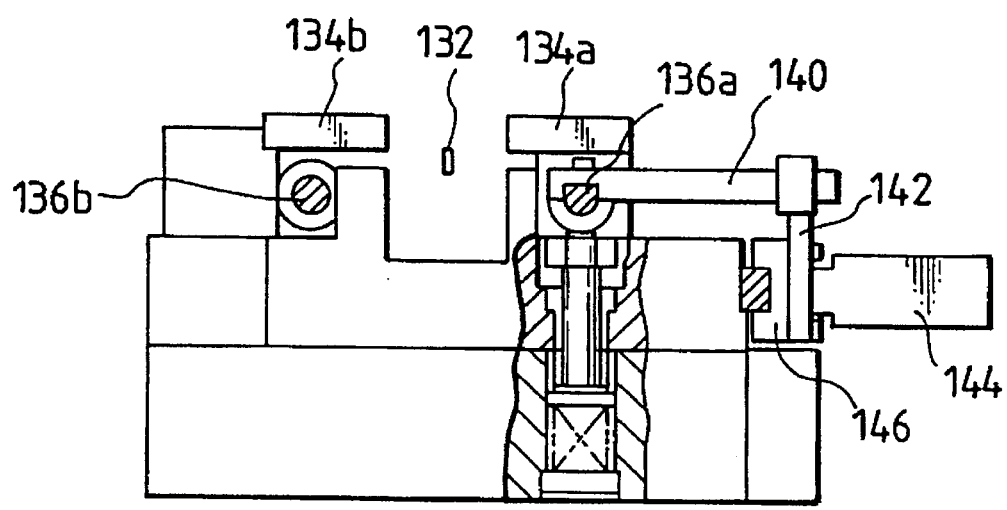
FIG. 10 is an illustration showing the feed mechanism portion of the die shown in FIG. 8.

FIGS. 8, 9 and 10 show a die in which piece parts are fed in given increments by means of a feed bar. FIG. 8 is a plan view of the lower part of a die which has working stages 130 provided at given intervals on the die surface, as in the embodiment described above. The feed bar indicated by 132 is an elongated plate member for transporting the work (see FIG. 9) and it is provided slidably in a slit hole that runs through the entire length of the lower part of the die. The feed bar 132 has along its upper edge a plurality of pockets 132a that engage the bottom surface of the work's package. The pockets 132a are provided at the same interval as the working stages 130 in accordance with the number of the latter. Thus, the number of pockets 132a to be provided is equal to the number of the working stages plus one.

The feed bar 132 is provided such a way that it is movable not only vertically but also back and forth with respect to the die surface. When it is in the UP position, the feed bar 132 carries the work in pocket 132a and feeds it by one pitch; when it is in the DOWN position, the feed bar moves back to the initial position. Thus, the feed bar feeds the work consecutively by repeating the combined actions of vertical and horizontal movements.

To effect these actions, vertically driven feed plates 134a and 134b are provided on opposite sides of the train of working stages 130, and slide rods 136a and 136b are supported by guides beneath the feed plates 134a and 134b, respectively, in a direction parallel to the transport of the work. The slide rods 136a and 136b are connected by plates 138a and 138b which are fixed at opposite ends. Opposite ends of each feed plate 134a or 134b are fixed to the connecting plates 138a and 138b, whereby both feed plates are supported along their length.

To have the feed bar 132 move back and forth, the slide rods 136a and 136b must be moved reciprocally. The reciprocal movements of the slide rods 136a and 136b are effected by providing a feed drive mechanism on the working machine as in the case of the embodiment described above. Specifically, a horizontal pushing arm 140 extends from the central part of the length of slide rod 136a in such a direction that it moves away from the operator facing the front part of the machine. A support plate 142 is fixed in a downward direction to the end portion of the pushing arm 140. A butt block 144 facing outward is fixed to the outer surface of the support plate 142. The butt block 144 is mounted at the same height as the cylinders 70a and 70b, as well as the pushers 72a and 72b. To effect guided movement of the butt block 144 along the outer lateral surface of the lower part of the die, a slide guide 146 is provided to guide and support the support plate 142.

In order to restrict the range over which the butt block 144 can move in the embodiment under consideration, shock-absorbing stoppers 148a and 148b are provided on opposite sides between which the butt block 144 is located (see FIG. 8). As the butt block 144 moves back and forth, either lateral side of the block will contact the stopper 148a or 148b; thereby restricting the position of the moving butt block 144 and, hence, the stroke of movement of the feed bar 132.

The die of the embodiment under consideration is set in the lead working machine in the same manner as shown in FIG. 3, whereupon the work can be fed consecutively by the feed bar and subjected to the required working processes.

The sequence of working actions with the die according to the embodiment under consideration may be as follows. When effecting press working on the die surface, the feed bar 132 is located in the retracted position below the die surface. After press working, the upper part of the die ascends and, at the same time, the feed plates 134a and 134b also move up. In synchronism with these movements, the feed bar 132 is lifted and the piece parts that have been processed in the respective working stages 130 are supported by the feed bar 132 such that they are placed in engagement with the pockets 132a. Subsequently, the butt block 144 is pushed by the feed drive mechanism until it contacts the stopper 148b, whereupon it stops moving. In this advanced position, the feed bar 132 is driven to descend and each of the piece parts is transferred to the next stage.

After descending into the lower part of the die, the feed bar 132 which is now in the DOWN position moves back to the initial position, where it is ready for the next transport cycle. The retraction of the feed bar 132 is effected by the feed drive mechanism on the working machine and it stops when the butt block 144 contacts the stopper 148a. Thus, the horizontal movement of the feed bar 132 combines with the vertical movements of the feed plates 134a and 134b to insure that the work is consecutively transported to the next working stage 130 to achieve continuous working operations.

Work transfer mechanism

As described above, the lead working machine of the embodiment under consideration is designed so that various types of dies can be used in accordance with the product type. To insure such versatility or flexibility, the machine must be so designed that the product can be efficiently transferred from the first to the second die irrespective of whether the work is a leadframe or a piece part. As already mentioned, the manner in which the work is transferred from the first to the second die depends on the working schedule and it may be transferred to the second die either as a leadframe or as a piece part which is obtained by separating the product portion of the leadframe in the first die.

To enable transfer in either of these cases, the working machine of the embodiment under consideration has the following three elements provided intermediate between the first and the second dies: a rail mechanism for guiding the top and bottom rails of the leadframe; an ejector chute for ejecting the unwanted frame which remains after separating piece parts in the first die; and a pickup mechanism for transferring the thus separated piece part to the second die.

Figure 11:
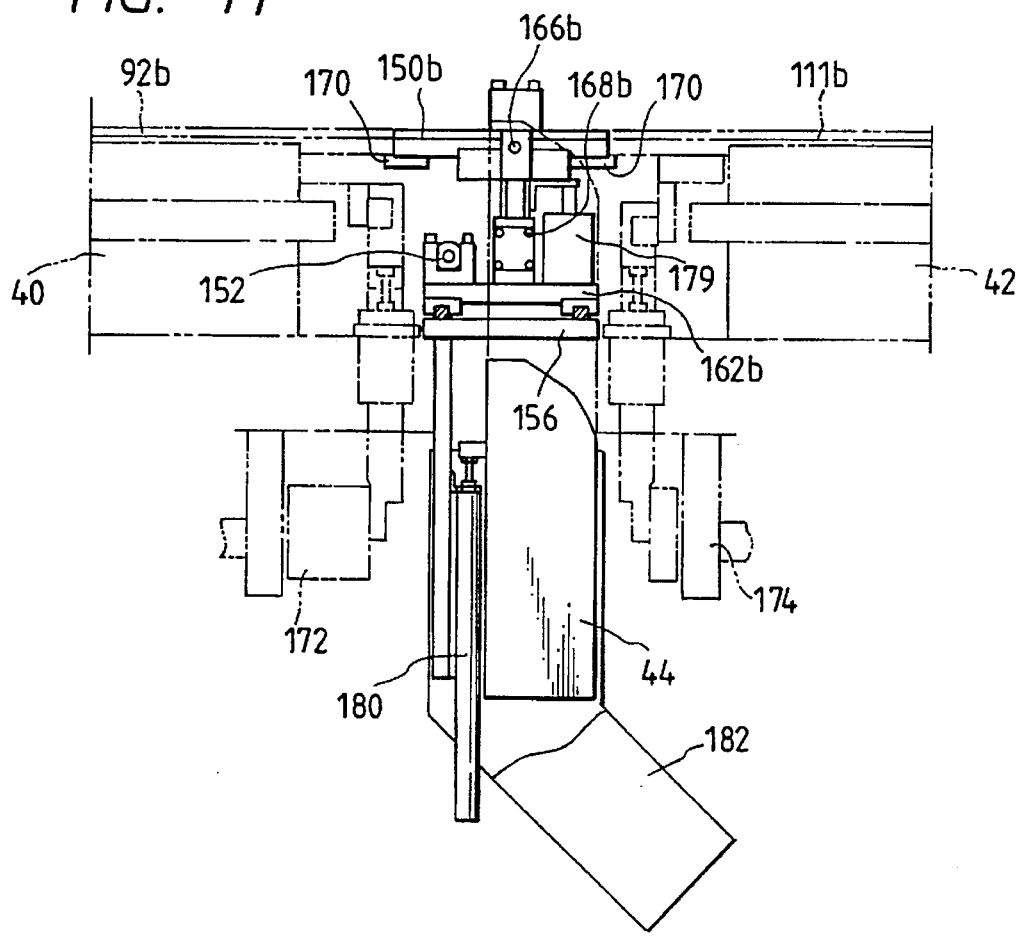
FIG. 11 is an illustration showing the layout of the rail mechanism and the ejector chute mechanism as seen from the side.
Figure 12:
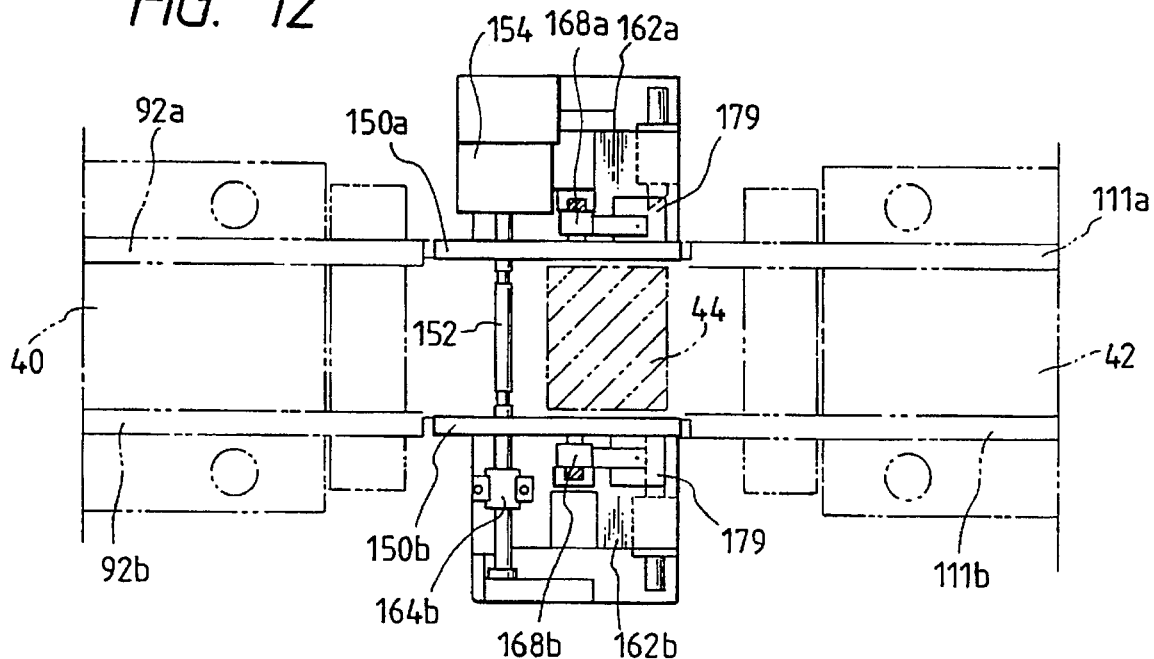
FIG. 12 is an illustration showing the layout of the rail mechanism as seen from above.

FIG. 11 is an illustration showing the layout of the components of the rail and ejector chute mechanisms as seen from the front, and FIG. 12 is a corresponding illustration, as seen from above. It should be noted here that the rail mechanism is used where the work is a leadframe that is transported not only on the first die but also on the second die, whereas the ejector chute is used for ejecting the unwanted frame portion which remains after separating piece parts from the leadframe in the first die. Therefore, the ejector chute is not used when working on a leadframe which is transported on both the first and the second dies, and the rail mechanism is not used in the case where a piece part is to be transferred from the first to the second die.

Rail mechanism

Referring to FIG. 12, numerals 150a and 150b represent moving rails that have grooves formed in their inner lateral surface for guiding the top and bottom rails of the leadframe, and these rails are placed in a face-to-face relationship in a position intermediate between the first die 40 and the second die 42. The two rails are supported such that their spacing is adjustably variable; at the same time, the rails are supported vertically movable in such a way that they will move up and down in synchronism with the movements of the feed plates 92a and 92b on the first die 40 and those of the feed plates 111a and 111b on the second die 42.

The spacing between the moving rails 150a and 150b is made variable by a mechanism such that a screw shaft 152 installed between the two rails at right angles thereto is rotated with an electric motor 154. The screw shaft 152 may be replaced by a rack-and-pinion system, a belt or any other mechanisms that are capable of permitting the rails 150a and 150b to stop at predetermined positions with the requisite precision.

Figure 13:
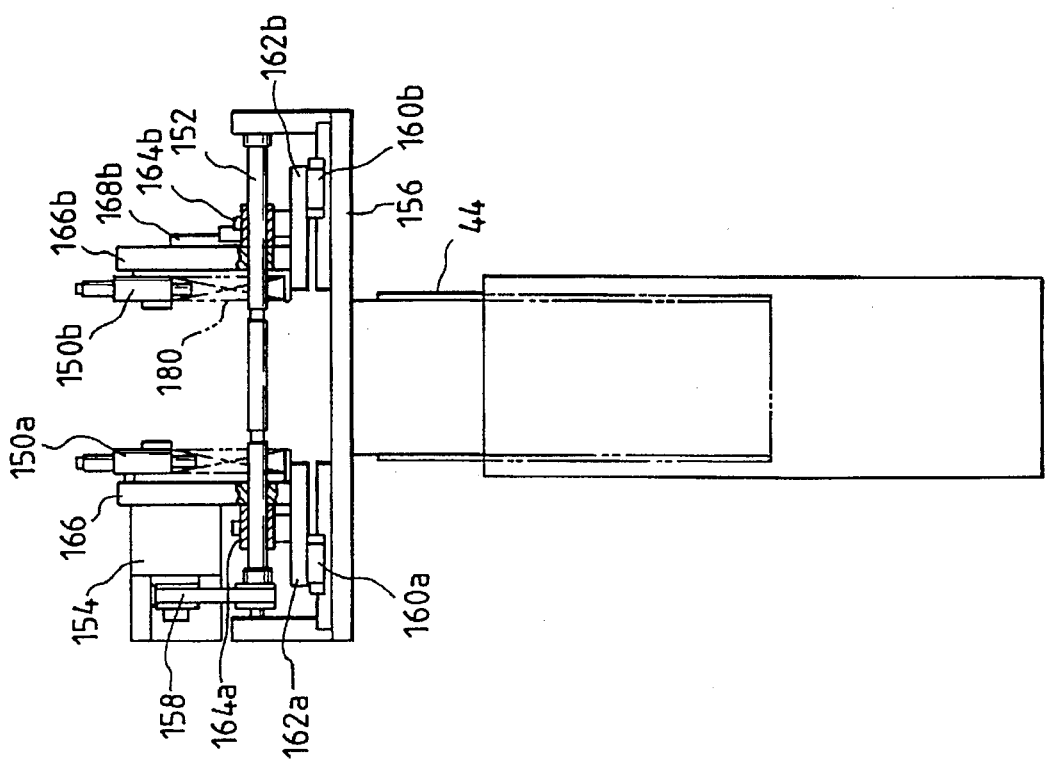
FIG. 13 is an illustration showing the layout of the rail mechanism and the ejector chute mechanism as seen from the front.

FIG. 13 shows the mechanism for adjusting the spacing between the rails 150a and 150b with the electric motor 154.

In the drawing, numeral 156 refers to a fixed plate for supporting the rail mechanism. The plate 156 is fixed to the base 60. The electric motor 154 is fixed to that part of the plate 156 which is outside the rail 150a and operatively associated with the screw shaft 152 via a belt 158. The plate 156 also carries slide plates 162a and 162b which are supported to be movable in the direction of width via slide guides 160a and 160b, respectively, which guide the widthwise movements of the rails 150a and 150b. Nut elements 164a and 164b which mesh with the screw shaft 152 are fixed to the slide plates 162a and 162b, respectively.

The screw shaft 152 is adapted to mesh with the nut elements 164a and 164b by means of inverse thread, so that the spacing between the rails 150a and 150b can be adjusted by changing the direction in which the screw shaft 152 turns.

As shown in FIG. 13, the rail 150a (or 150b) is supported by being fixed to the inner lateral surface of a support arm 166a (or 166b) which is erected on the slide plate 162a (or 162b); therefore, to adjust the spacing between the rails 150a and 150b, one may turn the screw shaft 152 with the electric motor 154, whereby the spacing between the slide plates 162a and 162b is adjusted accordingly.

The support arm 166a (or 166b) is provided with a slide guide 168a (or 168b) that permits guided vertical movements of the rail 150a (or 150b).

Each of the rails 150a and 150b has an engagement plate 170 provided on the underside at either end, as shown in FIG. 11, and one engagement plate engages an end of each of the feed plates 92a and 92b on the first die 40 and the other engagement plate engages an end of each of the feed plates 111a and 111b on the second die 42. Because of this arrangement, the rails 150a and 150b will descend in synchronism with the descending movement of the feed plates 92a, 92b, 111a and 111b.

Shown by 172 (or 174) is a mechanism for lowering the feed plates provided on the first die 40 (or 42). The mechanism 172 (or 174) actuates the forced lowering of the feed plates 92a and 92b (or 111a and 111b) in synchronism with the consecutive feed of the work. In response to the vertical movements of the feed plates 92a, 92b, 111a and 111b, the rails 150a and 150b move up and down to effect the precise guided transfer of the leadframe.

The rails 150a and 150b are returned to the UP position by the resilience of a spring 180 (see FIG. 13). The spring 180 may be replaced by a drive element such as an air cylinder.

As described above, the rail mechanism of the embodiment under consideration has the moving rails 150a and 150b provided between the first die 40 and the second die 42 and the product is transported with the spacing between the rails being adjusted in accordance with the product type. Because of this arrangement, the working machine of the invention is applicable to a broad range of product types. Further, the rails 150a and 150b are allowed to move up and down in response to vertical movements of the feed plates 92a, 92b, 111a and 111b and this enables the work to be transferred continuously from the first die 40 to the second die 42, thereby accomplishing continuous working.

As was already mentioned, the rails 150a and 150b are brought into engagement with the feed plates 92a and 92b on the first die 40, as well as with the feed plates 111a and 111b on the second die 42 by means of the engagement plates 170 when a working operation is conducted. However, when replacing the dies, the rails 150a and 150b must be disengaged not only from the first die 40 but also from the second die 42 in order to provide ease in die replacement and setting operations. To this end, the machine of the embodiment under consideration has an air cylinder 179 provided below the rails 150a and 150b (see FIG. 11) so that they can be lowered from the engagement position before die replacement is started.

Ejector chute mechanism

In FIG. 11, numeral 44 refers to the ejector chute for ejecting the unwanted frame out of the first die 40. As shown, the ejector chute 44 is provided in a vertically movable manner in a position intermediate between the rails 150a and 150b. The ejector chute 44 is formed as a tube having a rectangular cross section and has an inlet provided on the side where the unwanted frame is admitted. An air cylinder 180 causes the ejector chute 44 to be moved up and down. As shown in FIG. 11, the ejector chute 44 is used either in the DOWN position where the upper end of the chute is located below the support plate 156 or in the UP position where the inlet of the chute is located generally at the same height as the feed plates 92a and 92b on the first die 40.

An ejection guide 182 is positioned below the chute 44. The guide 182 receives the unwanted frame as it drops down the chute 44 and sends it into a scrap box. The guide 182 is fitted over the chute 44 and its lower part is inclined toward the scrap box.

In the case of working a leadframe, as it is transported between the first die 40 and the second die 42, the ejector chute 44 is lowered to the DOWN position which is the retracted position where the chute will not interfere with the movement of the rails 150a and 150b. If the first die 40 is of a type that separates the product portion from the leadframe, the chute is set in the UP position.

If the first die is of a type that the leadframe is subjected to the necessary working processes with the product portions being then separated into piece parts, the unwanted frames are ejected as the supplied leadframes are successively transported. The ejector chute 44 admits through the inlet the unwanted frames as they are ejected from the first die and the admitted frames slide down the guide 182 to be discharged into the scrap box.

Thus, the unwanted frames can be easily ejected between the first die 40 and the second die 42 without affecting the layout of the two dies.

Pickup mechanism

We will now describe the pickup mechanism for transferring a piece part from the first die 40 to the second die 42. The pickup mechanism has a pickup portion that picks up a piece part from the first die 40 and a replacement actuating portion by which the piece part as supported by the pickup portion is moved for placement on the second die 42. The pickup mechanism of the embodiment under consideration uses suction pads to suck pneumatically the piece part that has been transported to the ejection end of the first die 40; the pickup mechanism then lifts the piece part and moves it to a position above the second die 42, then places it on the die surface of the second die 42.

Figure 14:
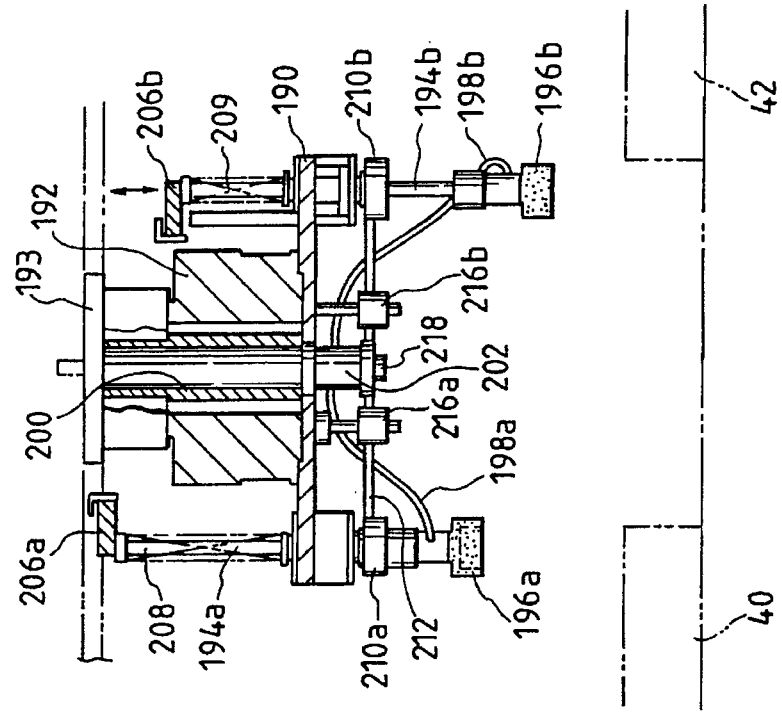
FIG. 14 is an illustration showing the layout of the pickup mechanism as seen from the side.

To effect these actions, a rotating plate 190 is provided above a position intermediate between the first die 40 and the second die 42 in such a way that the plate is driven to rotate in a horizontal plane by means of a servo motor 192 (see FIG. 14). The rotating plate 190 is furnished with a suction mechanism for supporting piece parts by suction. The servo motor 192 is mounted, with its face down, to a base plate 193, and the rotating plate 190 is fixed to its bottom end surface.

The suction mechanism has moving rods 194a and 194b that are mounted to the rotating plate 190 in a vertically movable manner, as well as suction pads 196a and 196b that are mounted to the lower ends of the moving rods 194a and 194b, respectively. It should be noted that the moving rods 194a and 194b are mounted to the rotating plate 190 such that they are capable of not only vertical movements but also free rotation about their own axis. Air is connected to the suction pad 196 (or 196b) via an air tube 198a (or 198b) which is connected at one end to the pad 196a (or 196b) and which communicates at the other end to an air supply through a pipe 200 that is fixed, with its face down, to the base plate 193.

The servo motor 192 used in the embodiment under consideration has a through-hole formed in the central portion, through which the fixed pipe 200 is inserted (see FIG. 14). The air tubes 198a and 198b are connected to the fixed pipe 200 by means of a rotary air joint 202 so that the tubes will not interfere with the rotation of the suction mechanism. The servo motor 192 is a part of the rotational drive means but, needless to say, it is by no means limited to the type used in the embodiment under consideration.

Figure 15:
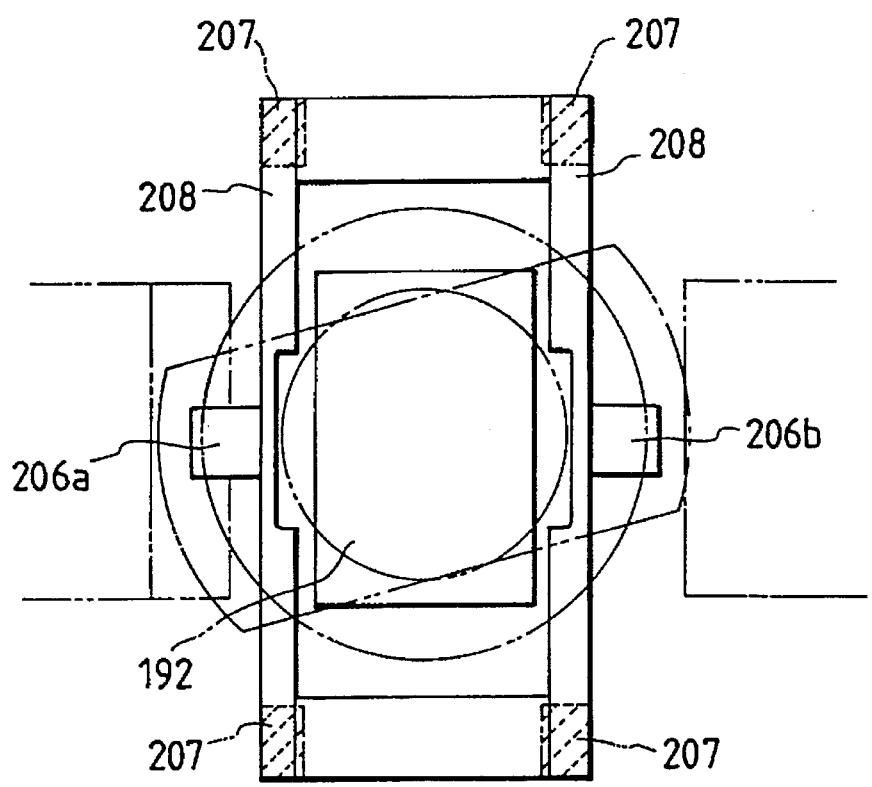
FIG. 15 is an illustration showing the portion that drives the pushing plates in the pickup mechanism.

To drive the moving rod 194a (or 194b) vertically, a pushing plate 206a (or 206b) is placed in contact with its top end surface and the plate 206a (or 206b) is driven vertically by means of an air cylinder. FIG. 15 illustrates how the pushing plates 206a and 206b are pushed by air cylinders 207.

In FIG. 15, numeral 208 refers to a pushing arm that has the pushing plate 206a (or 206b) fixed to the central part of its length. The pushing arms 208 are supported in a vertically movable manner above opposing sides between which the servo motor 192 is located, and the drive rod of air cylinder 207 is fixed to both ends of each pushing arm 208. Extending the drive rods of the air cylinders 207 causes the plates 206a and 206b to be pushed out. It should be mentioned here that the rod 194a (or 194b) is moved upward by the resilience of a spring 209 that is fitted over the rod.

Figure 16:
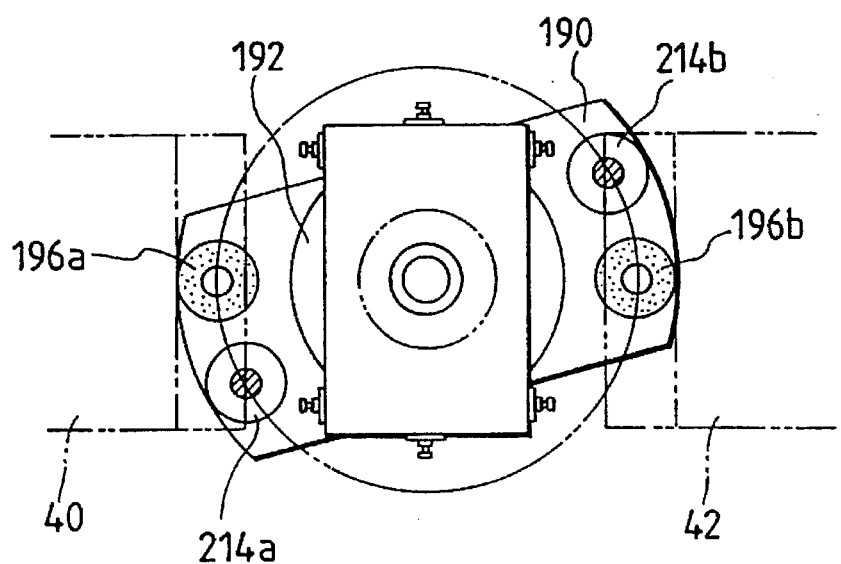
FIG. 16 is an illustration showing the layout of the suction mechanism in the pickup mechanism.

FIG. 16 shows the rotating plate 190 and the positions of suction pads 196a and 196b relative to the plate 190, as they are seen from above. The suction pads 196a and 196b are designed so that they will transfer piece parts from the first die 40 to the second die 42 each time the rotating plate 190 turns 180°. To this end, the pads are arranged symmetrically with respect to the center of the plate 190 (see FIG. 16) and they are spaced apart such that when one of them is located above the position of ejection from the first die 40, the other pad is located above the position of supply to the second die 42. With a pair of suction mechanisms being thusly arranged symmetrically with respect to the center of the plate 190, each turning of the plate 190, 180° causes the positions of the suction pads 196a and 196b to reverse so that the piece part as carried by the first die 40 is transferred to the second die 42.

It should be noted that when the piece part is transferred from the first die 40 for placement on the second die 42, the orientation of the work may remain the same or it may be changed by 90°. This is because some products require that a specified direction be selected for the consecutive feed of the piece parts on the working stages. The machine of the embodiment under consideration is furnished with a mechanism that enables the selection of such specified directions.

Turning back to FIG. 14, numerals 210a and 210b refer to pulleys that are fixed to the moving rods 194a and 194b, respectively, below the rotating plate 190. A belt 212 is wound around the pulleys 210a and 210b so that when the rotating plate 190 turns, its rotating action is utilized to have the rods 194a and 194b rotate about their own axis.

Figure 17:
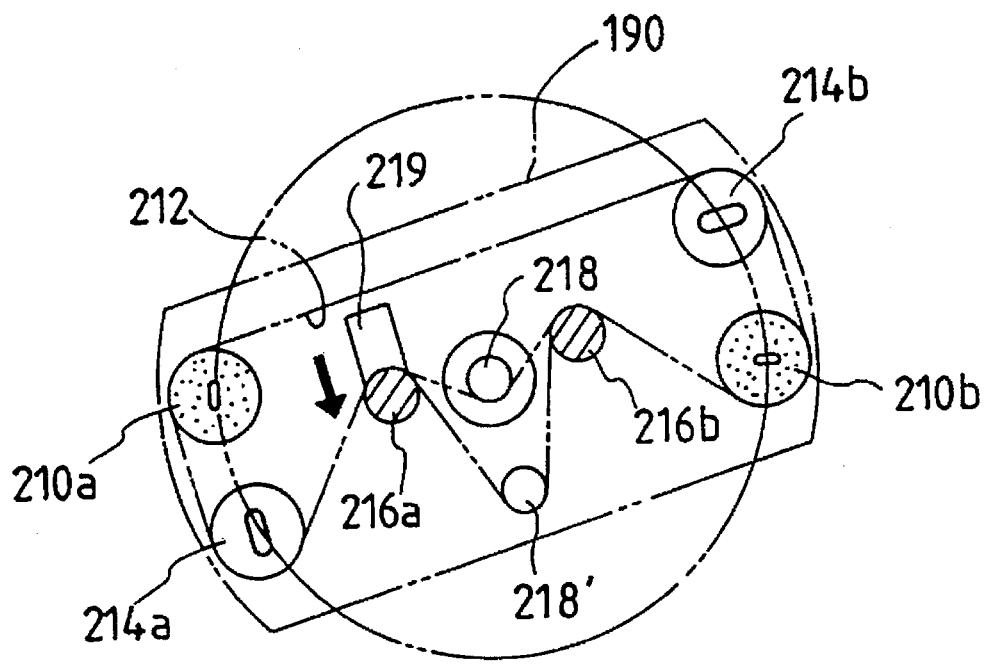
FIG. 17 is an illustration showing a first method of winding a belt around pulleys and the like in the pickup mechanism.
Figure 18:
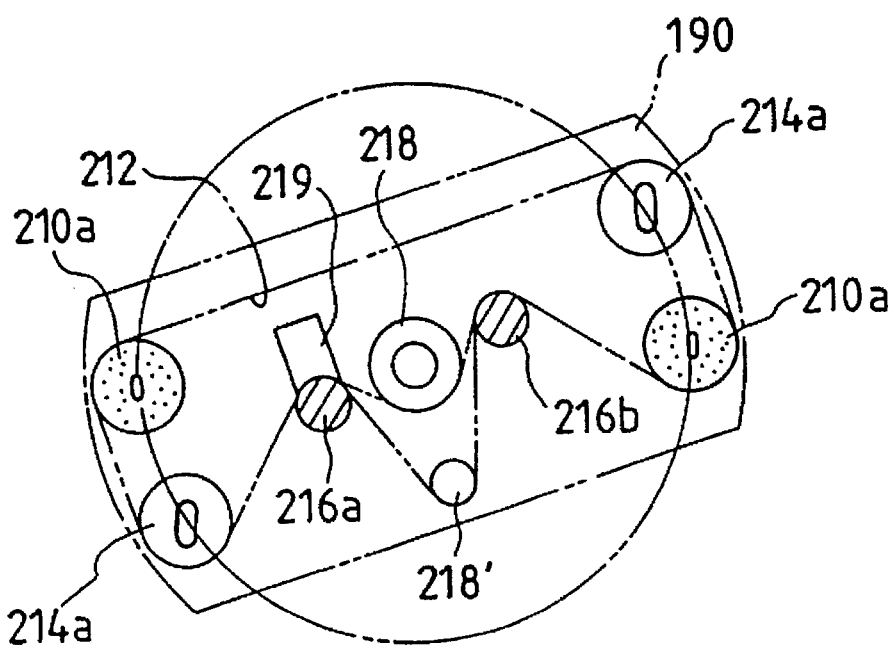
FIG. 18 is an illustration showing a second method of winding a belt around pulleys and the like in the pickup mechanism.
Figure 19:
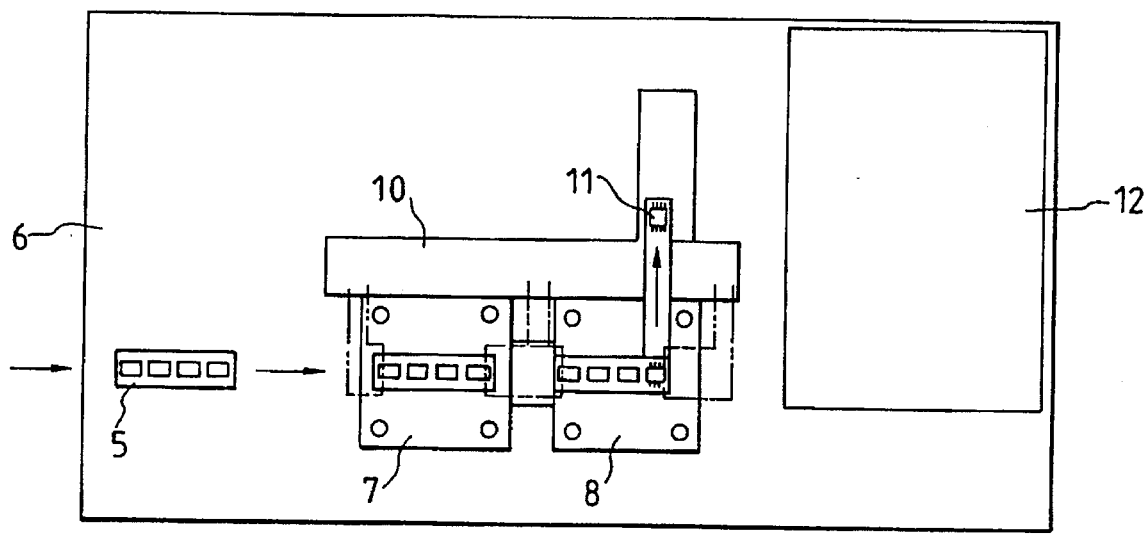
FIG. 19 is an illustration showing the construction of a conventional lead working machine.
Figure 20:
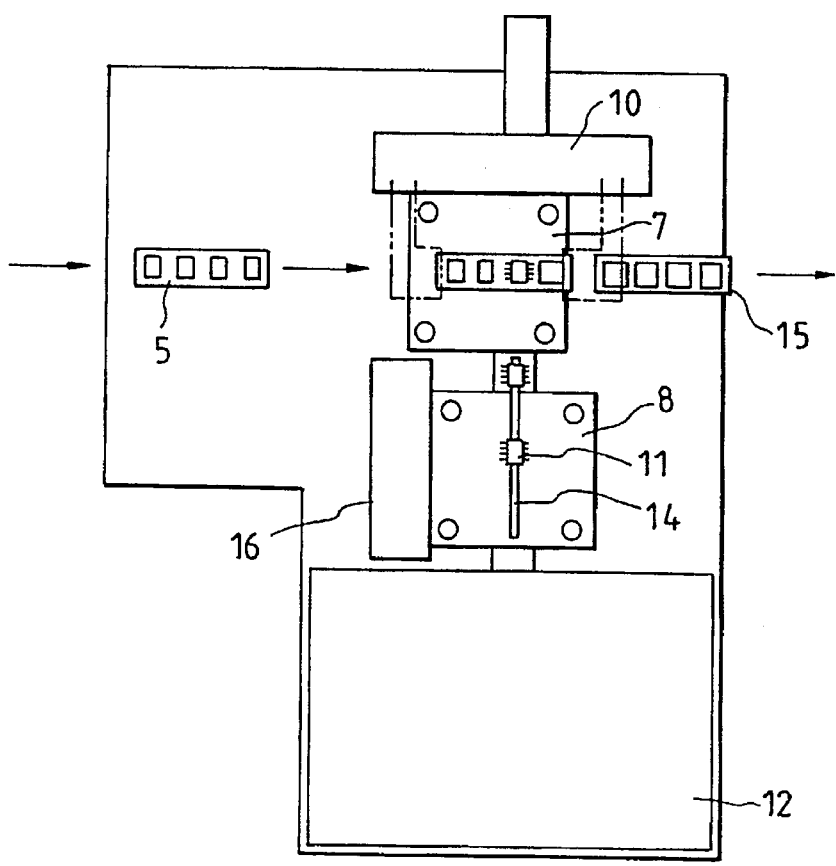
FIG. 20 is an illustration showing the construction of another prior art lead working machine.

FIGS. 17 and 18 illustrate the layout of the pulleys 210a and 210b on the rotating plate 190, as well as the layout of first pulleys 214a and 214b, second pulleys 216a and 216b, and a fixed pulley 218 that are positioned on the plate 190. The fixed plate 198 penetrates the center of the plate 190 to be fixed to the bottom end of the fixed pipe 200. In other words, the pulley 218 is fixed to the machine frame and the plate 190 is capable of turning with respect to the pulley 218. What is unique about the fixed pulley 218 is that it consists of two parts, one being the smaller-diameter pulley and the other being the larger-diameter pulley. The circumference of the smaller-diameter pulley is one half the circumference of each of the pulleys 210a and 210b, whereas the circumference of the larger-diameter pulley is equal to that of the pulleys 210a and 210b. As shown, the first pulley 214a (or 214b) is generally positioned side by side with respect to the pulley 210a (or 210b), and the second pulleys 216a and 216b are positioned diametrically and symmetrically with respect to the center of the fixed pulley 218, to which they are close.

FIGS. 17 and 18 both illustrate how the belt 212 is wound around the pulleys 210a and 210b, the first pulleys 214a and 214b, as well as other pulleys. The difference between the two figures is that in FIG. 17, the belt 212 is pressed against the smaller-diameter portion of the fixed pulley 218, whereas in FIG. 18, the belt is pressed against the larger-diameter portion of the pulley 218. By turning plate 190 180°, the piece part is placed on the second die with its orientation either changed by 90° (in the case shown in FIG. 17) or unchanged (FIG. 18) from the case where it was picked up from the first die. Thus, the machine of the embodiment under consideration permits the piece part to be placed on the second die in two different orientations by changing the manner in which the belt 212 is applied. The pulley 218 is a fixed pulley for turning 0° and 90°, whereas pulley 218' is a fixed pulley for turning 180°. That is, the belt 212 is wound around from the pulley 218 to the pulley 218', whereby turning of the pulleys 210 and 214 are fixed. At this time, a plate 219 is moved toward a direction indicated by an arrow in FIG. 17, while the turning plate 190 is turned. By turning plate 190 180°, the piece part is placed on the second die with its orientation either changed by 90° (in the case shown in FIG. 17) or 0°. Hence, the operator may select a suitable method of belt application in accordance with the desired product type.

In the machine of the embodiment under consideration, the length of the belt 212 is readjusted by sliding the plate 219 after belt replacement.

It should also be noted that if the rotating plate 190 is turned in the reverse direction, the piece part can be replaced on the second die with its orientation being changed by –90° (–270°). If the belt is not pressed against any part of the fixed pulley 218, a 180° change in orientation results.

As described above, the pickup mechanism moves the work from the first die and places it on the second die by coordinating the rotating motion of the plate 190, the vertical movements of the rods 194a and 194b, and the sucking action of the pads 196a and 196b specifically, the piece part ejected from the first die is supported by the sucking action of the pad 196a provided at the end of the descending rod 194a; after the rod 194a ascends, the plate 190 turns 180° so that the rod 194a moves to a point above the second die 42; subsequently, the rod 194a is lowered and the piece part is released from the pad 196a and placed on the second die 42; in this transfer mode, the other pad 196b is located above the first die 40 and is in the process of supporting the next piece part by suction.

Thus, each time the plate 190 turns 180°, a piece part is picked up from the first die 40 by suction and placed on the second die 42.

As described above, the pickup mechanism of the embodiment under consideration moves the piece part from the first die and places it on the second die each time the plate 190 is turned 180°. This contributes to efficient movement and replacement of the work, thereby proving effective in shortening the cycle time of the operation of moving and replacing the work. Further, a compact mechanism can be designed for moving and placing the work, and this feature is particularly advantageous when dies are to be set close to each other as in the case of the embodiment under consideration. Another feature is the selection of the orientation of the work during its movement and placement (it may be changed or unchanged in orientation from where it was picked up from the first die) and this can be effectively utilized in increasing the flexibility of the lead working machine.

In the embodiment under consideration, the pickup portions are provided on the plate 190 in two positions of inverse symmetry. If desired, pickup portions may be provided in four positions at 90° intervals and the plate 190 adjusted to turn by increments of 90°; this design enables the operator to inspect the work in the process of transfer between dies, such as by checking individual piece parts for integrity or detecting any broken punch by imagewise inspection of remaining dam bars.

Product receiving mechanism portion

The product that has passed through all the steps of working with the second die 42 is received by a receiving tray in the receiving mechanism portion C. As shown in FIG. 2, the receiving pickup head 52 in the receiving mechanism portion C sucks piece parts as they are transported from the second die 42 and places them in order into the receiving tray. As already mentioned, there are two different ways of working with the second die 42; in one case, piece parts are fed to the second die and, in the other case, the leadframe is transported from the first die 40 to the second die 42, where it is worked, and piece parts are finally separated from the leadframe. In the second case, the unwanted frame is ejected from the second die 42. To cope with this situation, an ejector chute 220 is fixed at the delivery end of the second die 42 as shown in FIG. 3 and each piece part is picked up by the receiving pickup head 52 and placed in the receiving tray, while the unwanted frame is discharged from the machine through the ejector chute 220. If no piece parts are separated from the leadframe in the first die 40 or the second die 42 so that the leadframe is delivered as the product from the second die 42, the ejector chute 220 is unnecessary. Considering these two cases, the ejector chute 220 may be provided in a vertically movable fashion.

As described on the foregoing pages, the general-purpose lead working machine of the invention is adapted for flexible use in working different types of products. To meet this need, the structures of dies are made common to various product types and so are the feed drive mechanisms provided on the main body of the machine and, at the same time, a rail mechanism, an ejector chute mechanism and a pickup mechanism are mounted between dies. Because of these two features, the working machine of the invention can be used irrespective of whether the work is fed as a leadframe, in piece parts or the like.

Specifically, the general-purpose lead working machine of the embodiment under consideration is capable of working the following objects by the working schedules also set forth below:

(1) The work may be a leadframe in the form of either a strip, a piece part or a hoop.

(2) The method of working with the first die can be selected from among: i) working on a transported leadframe strip, ii) transporting a leadframe strip and separating piece parts in the final working stage, iii) working on transported piece parts of a leadframe, iv) working on a leadframe transported as it is unwound from a hoop, and v) transporting a leadframe unwound from a hoop and separating piece parts in the final working stage.

(3) The rail mechanism which is provided in areas intermediate between the two dies enables guided transport, and the combination of the pickup and ejector chute mechanisms also provided intermediate between the dies enables transfer of a piece part from the first die to the second die.

(4) The method of working with the second die can be selected from among: i) working on a transported leadframe strip, ii) transporting a leadframe strip and separating piece parts in the final working stage, iii) working on transported piece parts of a leadframe, iv) working on a transported leadframe as it is unwound from a hoop, and v) transporting a leadframe unwound from a hoop and separating piece parts in the final working stage.

(5) If the product is to be received as a leadframe strip, the receiving mechanism may be of the same design as the supply mechanism used in the working machine of the embodiment under consideration. The receiving mechanism used in the working machine of the embodiment under consideration enables piece parts to be received in a tray. The receiving mechanism may be so modified that the leadframe can be received as piece parts, optionally within sleeves, or that the leadframe can be rewound in a hoop.

(6) The work may be supplied as a leadframe strip but the supply mechanism may be so modified that the leadframe can be supplied either as piece parts or as it is unwound from a hoop.

In the actual lead working machine, control parameters such as the timing of the feed drive mechanisms and other elements vary from one die to another and, hence, individual dies are furnished with a memory unit loaded with the working schedule to be implemented by each die and the machine is designed so that when a die is set, the control program associated with that particular die is automatically read to perform control with a computer. The machine is also designed such that a die can be set in a predetermined position by placing it on the base 60 of the side closer to the operator and sliding it toward the other side of the machine. When the die is set properly, it will contact the electric circuits and control circuits such as air piping in the main body of the machine to establish the intended connections automatically.

In the embodiment described on the foregoing pages, two die units are set in the working and handling portion B. If a great number of working steps are involved in fabrication, three or more die units may be arranged in tandem. In this case, too, a transfer mechanism of the same construction as used in the embodiment described above, may be provided between adjacent dies so that the machine can be utilized in the working of various types of products.

As was described on the foregoing pages, the general-purpose lead working machine of the present invention has a plurality of dies arranged in tandem and working can be done with a selected mode of work transport between dies (i.e., the work is transported either as a leadframe or piece parts). In the prior art, those products which are transported by different methods must be worked using different machines. The invention enables such products to be worked by the same machine. Hence, the lead working machine of the invention, which can be used in the working of many kinds of products, has the advantage of versatile utility.

Also, the machine is compact, can be installed by a simple procedure and convenient to use in various aspects including the setting of dies.

Further, the feed drive mechanisms are provided on the main body of the machine, and the structures of dies are made common to various product types. These features facilitate the changing and setting of dies and offer marked advantages such as the capability of substituting and setting an appropriate die for a specific product and performing the required working processes.

Although the present invention has been fully described by way of the preferred embodiments thereof with reference to the accompanying drawings, various changes and modifications will be apparent to those having skill in this field. Therefore, unless these changes and modifications otherwise depart from the scope of the present invention, they should be construed as included therein.

What is claimed is:

1. A general-purpose lead working machine, comprising:
   a leadframe supply mechanism portion for supplying a plastic-molded leadframe to be worked in a strip, piece part or hoop form;
   a working and handling portion for performing working processes on the leadframe, said working and handling portion including a plurality of separately actulable dies arranged in tandem for performing the working processes, a direction of a working line of one of said dies aligning with that of a subsequent die, guide means for guiding the leadframe to be transported between said dies, and pickup means for picking up a piece part that has been obtained by separating a product portion of the leadframe in one of said dies to transport the piece part to the subsequent die; and
   a receiving mechanism portion for receiving worked products from said working and handling portion.

2. A general-purpose lead working machine as claimed in claim 1, wherein said guide means comprises a rail mechanism for guiding the top and bottom rail portions of the leadframe.

3. A general-purpose lead working machine as claimed in claim 1, wherein said plurality of dies perform the working processes of resin removal, dam bar cutting, lead tip cutting, and lead forming.

4. A general-purpose lead working machine as claimed in claim 1, further comprising control means for selecting one of said guide means and said pickup means according to the type of the plastic-molded leadframe to be worked.

5. A general-purpose lead working machine as claimed in claim 1, wherein said guide means further includes an ejector chute for ejecting a unwanted frame which results from the separation of piece parts from the leadframe in one of said dies.

6. A general-purpose lead working machine as claimed in claim 5, wherein said ejector chute is provided in a position intermediate between said one die and the subsequent die and in line with said one die so that said ejector chute is vertically movable between a retracted position below the height of transport of the work and an upper position at which the unwanted frame is admitted.

7. A general-purpose lead working machine as claimed in claim 1, wherein said guide means comprises a pair of moving rails which guide top and bottom rail portions of the leadframe and which are supported such that the distance between them is variable, and a drive mechanism for adjusting the distance between said moving rails according to the type of the leadframe to be worked.

8. A general-purpose lead working machine as claimed in claim 1, wherein said pickup means comprises a pickup portion for supporting a piece part that has been separated from the leadframe in one of said dies, and a replacement actuating portion for moving said pickup portion from said one die to the subseuent die to place the piece part supported by said pickup portion on the subsequent die.

9. A general-purpose lead working machine as claimed in claim 8, wherein said replacement actuating portion comprises:

a rotating plate mounted rotatably above a position intermediate between one of said dies and the subsequent die, said rotating plate having a pickup portion in two positions, one located above an exit end of said one die from which the piece part is to be transported and the other located above an entrance end of the subsequent die to which the piece part is to be transported; and a rotation drive portion for causing said rotating plate to turn 180° for every replacement action so that the piece part supported by said pickup portion is moved from said one die and placed on the subsequent die.

10. A general-purpose lead working machine as claimed in claim 9, wherein said replacement actuating portion further comprises means for selecting one of a first method in which the piece part, in response to the 180° turn of the rotating plate, is moved from said one die and placed on the subsequent die in the same direction as it was at the exit end of said one die from which it was transported and a second method in which said piece part is moved and placed 90° offset from the direction in which it was at said exit end of said one die.

11. A general-purpose lead working machine as claimed in claim 1, wherein said working and handling portion further comprises moving parts including feed arms for consecutive feed of the work in the dies, said moving parts being mounted on each of said dies, a feed drive mechanism provided beside each of the individual dies for advancing or retracting the moving parts mounted on said dies, said feed drive mechanism and said moving parts being provided such that they are operatively associated when said dies are set in the working and handling portion.

12. A general-purpose lead working machine as claimed in claim 11, wherein said feed drive mechanism for driving said dies is adapted to drive the individual dies independently of one another.

13. A general-purpose lead working machine as claimed in claim 12, wherein said feed drive mechanism comprises a pushing mechanism for pushing said moving parts on each die in an advancing direction and a retracting mechanism for moving back said moving parts which have been advanced by said pushing mechanism to an initial position, one of said pushing mechanism and said retracting mechanism being adapted to be driven by a ball screw.

14. A general-purpose lead working machine as claimed in claim 1, wherein said dies to be set in said working and handling portion are selected from among dies that depend on the transport of the leadframe, dies that depend on the transport of a piece part by suction, and dies that depend on the transport of a piece part by means of a feed bar.

15. A general-purpose lead working machine as claimed in claim 1, further comprising a control drive portion, wherein each of said dies to be set in said working and handling portion comprises a memory portion loaded with a working schedule predetermined for the specific work to be processed in said die and wherein, in response to the setting of said die in the working and handling portion, said working schedule is read automatically by said control drive portion, whereupon the guide means, said pickup means, said supply mechanism portion and said receiving mechanism portion are controlled according to said working schedule to perform the necessary working processes.

* * * * *